(12) United States Patent
Suehiro

(10) Patent No.: US 7,875,897 B2
(45) Date of Patent: Jan. 25, 2011

(54) LIGHT EMITTING DEVICE

(75) Inventor: Yoshinobu Suehiro, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 698 days.

(21) Appl. No.: 11/221,369

(22) Filed: Sep. 8, 2005

(65) Prior Publication Data

US 2006/0060867 A1    Mar. 23, 2006

(30) Foreign Application Priority Data

Sep. 9, 2004   (JP) ............................. 2004-263127
Aug. 5, 2005   (JP) ............................. 2005-228837

(51) Int. Cl.
*H01L 33/00*   (2010.01)
(52) U.S. Cl. ................................. 257/99; 257/E33.056
(58) Field of Classification Search ................. 257/81, 257/99, 100, E33.056, E33.058
See application file for complete search history.

(56) References Cited

U.S. PATENT DOCUMENTS

| | | | |
|---|---|---|---|
| 5,382,811 A |   | 1/1995 | Takahashi |
| 6,097,091 A |   | 8/2000 | Ohsumi |
| 6,576,930 B2 | * | 6/2003 | Reeh et al. ................. 257/98 |
| 2002/0146555 A1 | * | 10/2002 | Hattori ........................ 428/323 |
| 2002/0195587 A1 | * | 12/2002 | Srivastava et al. ...... 252/301.4 R |
| 2003/0025449 A1 | * | 2/2003 | Rossner ...................... 313/512 |
| 2003/0214233 A1 | * | 11/2003 | Takahashi et al. ........... 313/512 |
| 2004/0100192 A1 |   | 5/2004 | Yano et al. |
| 2006/0006404 A1 | * | 1/2006 | Ibbetson et al. ............... 257/99 |

2006/0261364 A1    11/2006   Suehiro et al.

FOREIGN PATENT DOCUMENTS

| | | | |
|---|---|---|---|
| CN | 1199921 A |   | 11/1998 |
| CN | 1508888 A |   | 6/2004 |
| CN | 1759492 |   | 10/2004 |
| EP | 1347517 | * | 9/2003 |
| EP | 1 603 170 A1 |   | 7/2005 |
| JP | 11-053919 |   | 2/1999 |
| JP | 2000-239801 |   | 9/2000 |
| JP | 2001-358371 |   | 12/2001 |
| JP | 2002-198570 |   | 7/2002 |
| JP | 2002-314142 |   | 10/2002 |
| JP | 2004-200531 A |   | 7/2004 |
| WO | 2004/082036 |   | 9/2004 |
| WO | WO 2004/082036 A1 |   | 9/2004 |

OTHER PUBLICATIONS

German Office Action dated Jan. 18, 2007, with English translation.
Chinese Office Action dated Apr. 6, 2007 with English Translation.
Chinese Office Action dated Sep. 21, 2007 with English Translation.
Third Chinese Office Action dated May 16, 2008 (with English translation).

* cited by examiner

*Primary Examiner*—Davienne Monbleau
*Assistant Examiner*—Matthew Reames
(74) *Attorney, Agent, or Firm*—McGinn IP Law Group, PLLC

(57) ABSTRACT

A light emitting device having: a light-emitting portion having a light emitting element flip-chip mounted, a first power supply portion that supplies power to the light emitting element, and an inorganic sealing material that seals the light emitting element; a second power supply portion that supplies power to the light-emitting portion; and a resin that seals the light-emitting portion. The resin comprises an optical-shaped surface.

18 Claims, 29 Drawing Sheets

1 LIGHT EMITTING DEVICE
10 BLACK COATING
2 LEAD
10A LIGHT-DISCHARGING PORTION

1 LIGHT EMITTING DEVICE
4 TRANSPARENT RESIN
11 MIRROR
3 LED
12 OVERCOAT

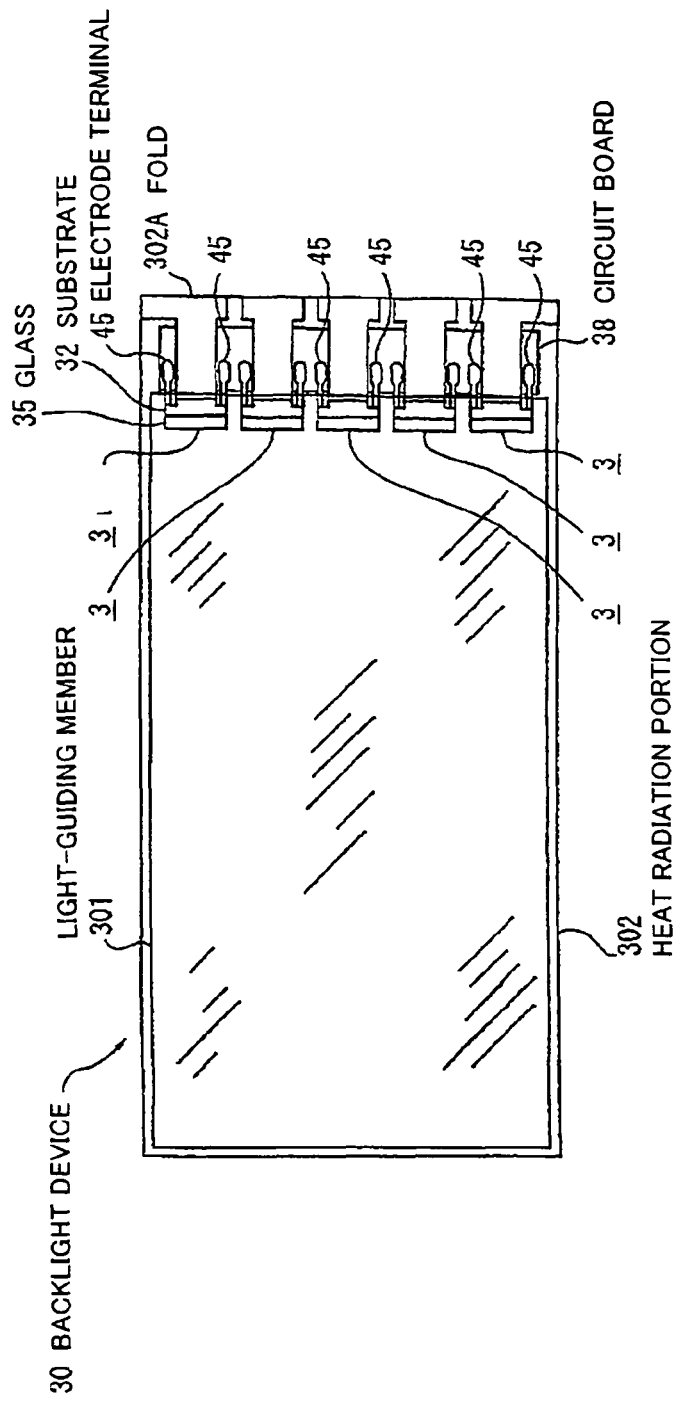
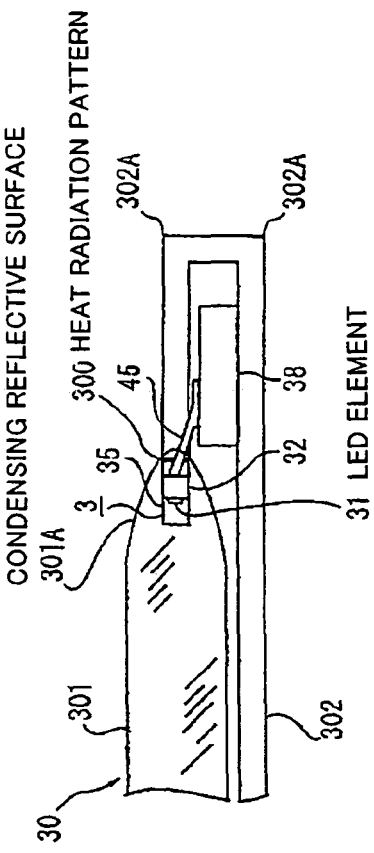
FIG.28A
FIG.28B

LIGHT EMITTING DEVICE

The present application is based on Japanese patent application Nos. 2004-263127 and 2005-228837, the entire contents of which are incorporated herein by reference.

BACKGROUND OF THE INVENTION

1. Field of the Invention

This invention relates to a light emitting device with a light emitting element such as an LED chip and, particularly, to a light emitting device that can prevent deterioration of a seal material and damage or deformation of LED chip due to the seal material.

Herein, an LED element is referred to as equivalent to LED chip.

2. Description of the Related Art

LED's (light emitting diodes) are characterized in low power consumption, small size, light weight, long life and low heat generation. Further, high-output blue LED's have been developed. Therefore, they are used for various applications such as electronic devices, household electrical appliances, automobiles, traffic lights, communications devices etc.

JP-A-2001-358371 discloses a light emitting device that a positive electrode and a negative electrode are disposed opposite on a base, and an LED chip is mounted on the electrodes, wherein heat generated from a light emitting layer can be directly conducted to the positive electrode through a junction material which is provided between an insulating film on a p-electrode of the LED chip and the positive electrode, so as to have a good heat radiation property (See paragraphs [0013], [0014] and [0016] and FIG. 1 thereof).

JP-A-2002-314142 discloses a light emitting device that an LED chip is mounted on a substrate and connected by wire bonding, and the LED chip is sealed with a silicone resin including a phosphor, wherein the mixed emission color of the LED chip is effected based on light absorption of the phosphor to have a constant emission property without changing color tone.

Conventionally, another light emitting device is known in which an LED chip is sealed with a resin material such as epoxy resin with low viscosity and pressure so as to prevent damage of the LED chip and deformation of bonding wires.

However, the conventional light emitting devices have problems as described below.

The light emitting device of JP-A-2001-358371 has a problem that the LED chip may be separated due to the thermal expansion of the junction material by heat generated from the LED chip.

The light emitting device of JP-A-2002-314142 has a problem that, when the silicone resin material for sealing is thermally expanded, the LED chip may be damaged or the bonding wires may be deformed.

Further, resin materials for sealing are more likely to deteriorate due to heat generated from the LED chip or light radiated therefrom according as LED chips have been developed to have higher output, shorter wavelength and larger current.

SUMMARY OF THE INVENTION

It is an object of the invention to provide a light emitting device that can prevent deterioration of a seal material and damage or deformation of LED chip due to the seal material.

(1) According to one aspect of the invention, a light emitting device comprises:
   a light-emitting portion comprising a light emitting element flip-chip mounted, a first power supply portion that supplies power to the light emitting element, and an inorganic sealing material that seals the light emitting element;
   a second power supply portion that supplies power to the light-emitting portion; and
   a resin that seals the light-emitting portion,
   wherein the resin comprises an optical-shaped surface.

(2) According to another aspect of the invention, a light emitting device comprises:
   a light-emitting portion comprising a light emitting element, a first power supply portion that comprises a conductive pattern on which the light emitting element is mounted and which supplies power to the light emitting element, and an inorganic sealing material that seals the light emitting element and has a thermal expansion coefficient equal to the first power supply portion;
   a second power supply portion that supplies power to the light-emitting portion; and
   a resin that seals the light-emitting portion,
   wherein the resin comprises an optical-shaped surface.

(3) According to another aspect of the invention, a light emitting device comprises:
   a light-emitting portion comprising a light emitting element, a first power supply portion that comprises a metal material that supplies power to the light emitting element, and an inorganic sealing material that seals the light emitting element;
   a second power supply portion that supplies power to the light-emitting portion; and
   a resin that seals the light-emitting portion,
   wherein the resin comprises an optical-shaped surface.

(4) According to another aspect of the invention, a light emitting device comprises:
   a light-emitting portion comprising a light emitting element flip-chip mounted, a first power supply portion that supplies power to the light emitting element, and an inorganic sealing material that seals the light emitting element, inorganic material comprising an optical shape that prevents a total reflection of light emitted from the light emitting element at an interface thereof to the air;
   a second power supply portion that supplies power to the light-emitting portion; and
   a resin that seals the light-emitting portion,
   wherein the resin comprises an optical-shaped surface.

ADVANTAGES OF THE INVENTION

A light emitting device of the invention can prevent deterioration of a seal material and damage or deformation of LED chip due to the seal material since the vicinity of the light emitting element likely to deteriorate is sealed with the glass sealing material as a stable material.

Further, the resin for sealing the light-emitting portion can be formed into arbitrary shape and therefore the freedom in shape or formation process can be enhanced.

BRIEF DESCRIPTION OF THE DRAWINGS

The preferred embodiments according to the invention will be explained below referring to the drawings, wherein:

FIG. 28A is a plain view showing a backlight device with plural LED's as shown FIG. 27A as a light source;

FIG. 28B is an enlarged side view showing part of the backlight device in FIG. 28A;

DETAILED DESCRIPTION OF THE PREFERRED EMBODIMENTS

First Embodiment (Construction of Light Emitting Device)

Figure 1A:
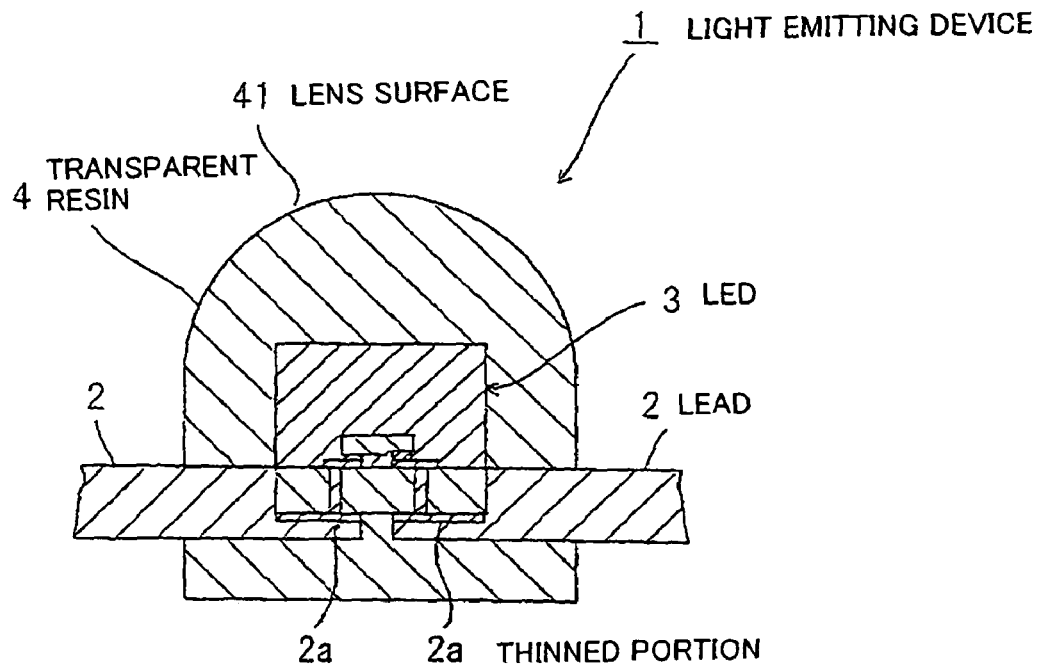
FIG. 1A is a cross sectional view showing a light emitting device in a first preferred embodiment according to the invention.
Figure 1B:
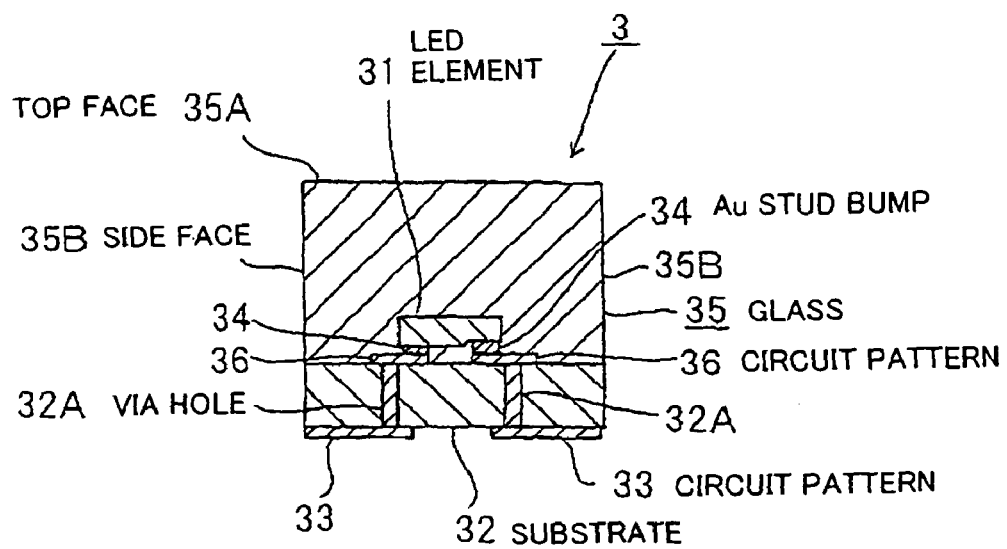
FIG. 1B is a cross sectional view showing an LED in FIG. 1A.

FIG. 1A is a cross sectional view showing a light emitting device in the first preferred embodiment according to the invention. FIG. 1B is a cross sectional view showing an LED in FIG. 1A.

As shown in FIG. 1A, the light emitting device 1 comprises: a pair of leads 2 made of silver-plated copper or copper alloy; an LED 3, as a light emitting portion, which is mounted on the lead 2; a transparent resin 4, made of epoxy resin etc., which seals the LED 3 to form a lamp-type device and is provided with a lens surface 41 as well as a semisphere having an LED element 31 as its origin.

The lead 2 is thinned corresponding to the shape of the LED 3 at a portion where the LED 3 is placed taking the positioning of the LED 3 into account, and the LED 3 is mounted on such a thinned portion 2a.

The LED 3, as shown in FIG. 1B, comprises the LED element 31, as a solid-state element, which is of flip-chip type and made of a GaN-based semiconductor material; a substrate 32 on which the LED element 31 is mounted and made of glass-containing $Al_2O_3$; a circuit pattern 33 which is formed on the bottom surface of the substrate 32 and made of tungsten(W)-nickel(Ni)-gold(Au); an Au stud bump 34 which electrically connects between the LED element 31 and the circuit pattern 33; and glass 35 which seals the LED element 31 and is bonded to the top surface of the substrate 32.

The LED element 31 is, for example, a GaN-based semiconductor element. In detail, it is constructed such that, on a sapphire substrate ($Al_2O_3$), GaN-based semiconductor layers such as $n^+$-GaN layer, n-GaN layer and MQW layer are epitaxially grown, an n-electrode is formed on the $n^+$-GaN layer, and a p-electrode is formed on a $p^+$-GaN layer.

The substrate 32 is provided with a via hole 32A formed at a given position, and a conductive portion is formed inside thereof. The upper end of the via hole 32A is connected to a circuit pattern 36 formed on the top surface of the substrate 32. The lower end of the via hole 32A is connected to the circuit pattern 33. A first power supplying portion is composed of the via hole 32A, the circuit pattern 33 and Au stud bump 34.

The glass 35 is made of $P_2O_5$—ZnO-based low-melting glass, which has a thermal expansion coefficient of $11.4 \times 10^{-6}/°C$., a yielding point of 415° C., a refractive index of n=1.59 and a internal transmittance of 99% (470 nm). It is bonded to the substrate 32 by hot pressing, and then cut by a dicer to have a rectangular shape with a top face 35A and a side face 35B.

(Process of Making the Light Emitting Device)

The process of making the light emitting device will be described below.

At first, the LED 3 is fabricated. The substrate 32 with the via hole 32A formed therein is provided, and then tungsten (W) paste is screen-printed on the surface of the substrate 32 corresponding to the circuit patterns 33, 36. Then, the substrate 32 with the W paste printed thereon is thermally treated at about 1000° C. to burn W into the surface of the substrate 32. Then, Ni plating and Au plating are provided on the W to form the circuit pattern 33, 36.

Then, the LED element 31 is electrically bonded through the Au stud bump 34 to the surface of the circuit pattern 36 on the substrate 32. Then, plate-like $P_2O_5$—ZnO-based low-melting glass is placed parallel to the substrate 32 with the LED element 31 mounted thereon, and then is hot-pressed thereto in nitrogen atmosphere. In this process, the viscosity of the low-melting glass is $10^8$ to $10^9$ poises, and the low-melting glass is bonded to the substrate 32 through oxides included therein. Then, the substrate 32 with the low-melting glass integrated therewith is diced by the dicer to divide it into the rectangular LED 3.

Then, the pair of leads 2 is linearly disposed opposite with a given distance. The LED 3 is mounted on the thinned portion of the leads 2, and the circuit pattern 33 of the LED 3 is solder-boned to the leads 2. Then, the transparent resin 4 of acrylic resin is injected in injection molding to seal an exposed part of the LED 3 and a tip portion of the leads 2 and to have the lens surface 41 on the top thereof. Thus, the light emitting device 1 is obtained.

Effects of the First Embodiment

The effects of the first embodiment are as follows.

(1) By using the low-melting glass and conducting the hot pressing at a high viscosity, the processing can be conducted at a temperature sufficiently lower than the crystal growth temperature.

(2) High bond strength between the substrate 32 and the glass 35 can be obtained by bonding them based on the chemical bond through the oxides. Therefore, a compact package can be developed even when its bond area is very small.

(3) Since the glass 35 has a thermal expansion coefficient equal to the substrate 32, a failure in bond such as peeling and cracking is less likely to occur even when they are brought into room temperature or a low temperature after the bonding at high temperature.

In addition, glass tends to be caused to crack due to tensile stress, but has a less incidence of cracking due to compressive stress, so the thermal expansion coefficient of the glass 35 is made slightly small compared to the substrate 32. The inventor confirms that no peeling or cracking occurs even at 1000 cycles of $-40°C. \leftrightarrow 100°C.$ liquid phase cold thermal shock tests.

Also, as basic confirmation of bonding of a 5×5 mm sized glass piece to a ceramic substrate, experiments of combinations of various thermal expansion coefficients of glass and ceramic substrate verify that bonding is possible without cracking when the ratio of the low to high thermal expansion coefficient member is 0.85 or more. Although depending on the stiffness and size of the members, the same thermal expansion coefficient indicates this extent of range.

(4) Since no wire is required for the flip-chip mounting, no failure in electrode occurs in high viscous processing. Since the viscosity of the low melting point glass during sealing is as hard as $10^8$-$10^9$ poises which is significantly different in material properties compared to the order of 5 poises of liquid epoxy resin prior to thermal curing, no problems such as wire crushing and deformation occur when a face-up LED element is sealed in which electrodes on element surface and power-feeding members such as leads are electrically connected to each other by wires.

Also, when a flip-chip LED element is sealed in which electrodes on element surface are flip-chip bonded to a power supplying member such as a lead through a bump such as gold (Au), it is possible to prevent bump crushing and a short-circuit between bumps due to pressure acting on the LED element in the direction of the power supplying member according to the viscosity of glass.

(5) Since the glass 35 and the substrate 32 are set parallel to each other and hot-pressed in a high viscous state, so as to move the glass 35 to the surface of the substrate 32 and bring it into close contact therewith, no void occurs in sealing the GaN-based LED element 31.

(6) Since the circuit pattern 36 on the substrate 32 is drawn out to the circuit pattern 33 on the bottom side through the via-hole 32A, there is no need of taking a particular action for preventing the glass from penetrating into unwanted portions and from covering electrical terminals, thereby allowing the simplifying of the fabrication process. Also, since plural devices are collectively sealed with the plate-like low melting point glass, plural LED's 1 can be easy mass-produced by dicer cutting. Since the low melting point glass is processed in a high viscous state, without any need of taking a sufficient action as in resin, it is sufficiently possible to treat mass-production even without via-hole, provided that external terminals are drawn out to the bottom side.

(7) Since the GaN-based LED element 31 is flip-chip mounted, there are also the effects of being capable of overcoming the problems in developing the glass sealing, and of developing 0.5 mm-square ultra-small sized light emitting device 1.

This is because no wire boding space is required, and no interface peeling occurs even in bonding in a small space by selecting the glass 35 and the substrate 32 to have an equal thermal expansion coefficient and by the firm chemical bond.

(8) Since the vicinity of the LED element 31 likely to deteriorate is sealed with the glass 35 as a stable material, not the resin, optical absorption or lowering of the external light radiation efficiency in the LED 3 due to the deterioration of the seal material caused by the heat generation and emission of the LED element 31 can be prevented. Especially, when the LED element 31 is made of a GaN-based material, the reason of the lowering of light output is mainly caused by the deterioration of the seal material. Thus, by using the glass 35, the LED 3 with significantly reduced deterioration in light output can be developed.

Although it may be assumed that a silicone resin is used in place of the epoxy resin highly subject to the deterioration, the silicone resin has a problem that the light output lowers 5 to 10% since it has a refractive index a little lower than the epoxy resin. In this regard, the glass can have a refractive index higher than the epoxy resin.

(9) With the acrylic resin less likely to deteriorate by light or heat and with the optical-shaped surface 41, not only the vicinity of the LED element 31 but also the transparent resin 4 can be prevented from the deterioration as well as obtaining the optical radiation property according to the optical-shaped surface for long hours.

(10) The transparent resin 4 for sealing the LED 3 can be easy formed into an arbitrary shape by injection molding. Thus, freedom in molding and shape can be enhanced. For example, the LED 3 has the rectangular shape easiest for the mass production and is a compact package that allows a number of retrieved products and the lowering of cost. Further, it can have a size needed to form the optical-shaped surface as well as allowing that light from the LED element 31 is externally radiated without generating the birefringence at the interface of the LED 3 and at the interface of the transparent resin 4 when sealing the LED element 31 with the resin. This can be effected when, as shown in FIG. 1A, the transparent resin 4 has a diameter twice the width of the LED 3 which is defined as a width relative to the central axis of the LED element 31. Thus, the optical shape with the small size can be made easier and at lower cost than the case of using only the glass.

Although in this embodiment the acrylic resin is used in injection molding, another thermoplastic resin other than the acrylic resin can be used therein. For example, epoxy resin may be used for transfer molding or cast molding. In this case, since there is provided the glass 35 between the epoxy resin and the LED element 31 and therefore heat and light from the LED element 31 can be spread in low energy density, deterioration of the epoxy resin can be significantly reduced as compared to the conventional case that the LED element 31 is sealed with only epoxy resin.

Second Embodiment

Figure 2A:
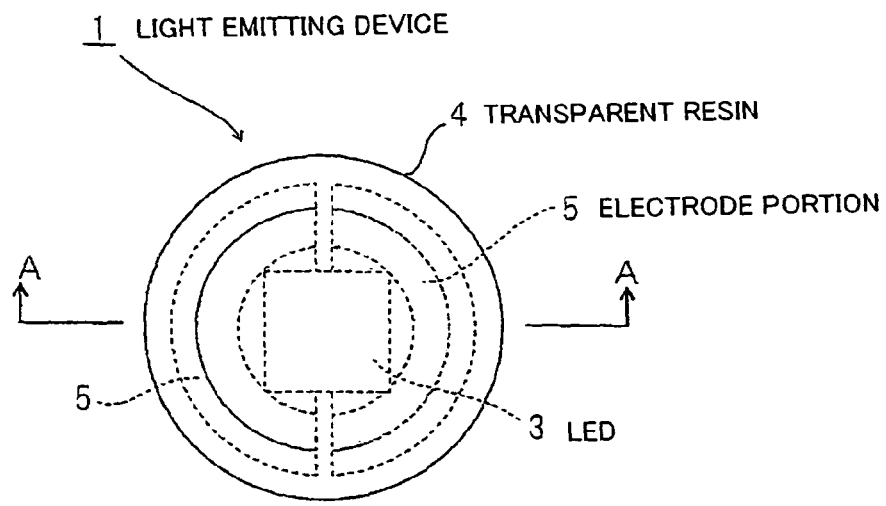
FIG. 2A is a plain view showing a light emitting device in a second preferred embodiment according to the invention.
Figure 2B:
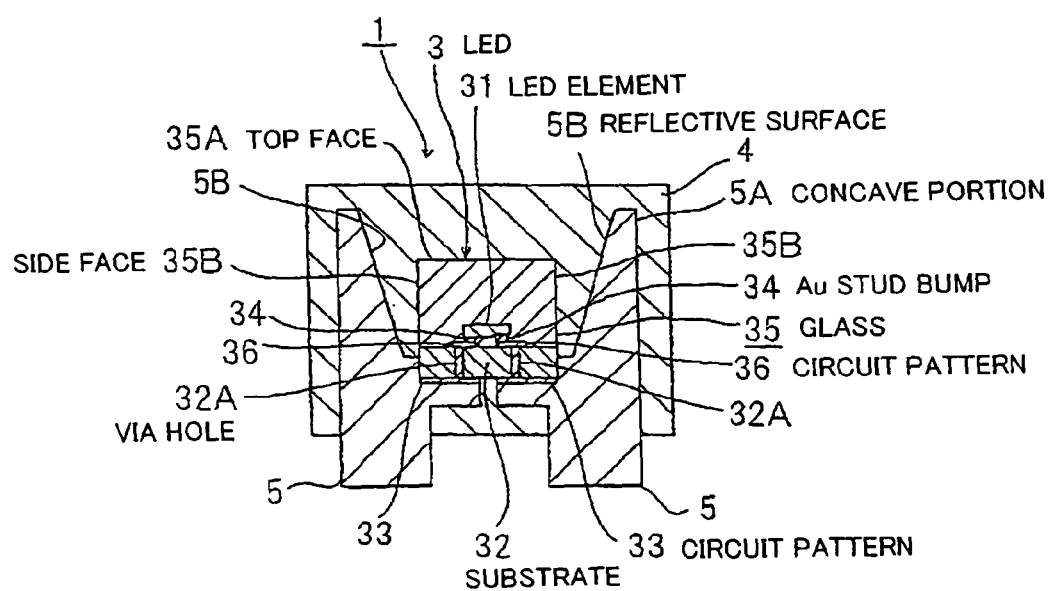
FIG. 2B is a cross sectional view cut along a line A-A in FIG. 2A.

FIG. 2A is a plain view showing a light emitting device in the second preferred embodiment according to the invention. FIG. 2B is a cross sectional view cut along a line A-A in FIG. 2A. Like components are indicated below by the same numerals as used in the first embodiment.

The light emitting device of the second embodiment is different from that of the first embodiment in that a second power supplying portion thereof is, in place of the lead 2, composed by an electrode portion 5 which is made of copper or copper alloy, formed cylindrical in schematic shape, and provided with a concave portion 5A inside of which the LED 3 is mounted and a reflective surface 5B is formed. The LED 3 as shown in FIG. 1B is mounted on the bottom of the electrode portion 5, and the transparent resin 4 seals the LED 3 and the upper portion of the electrode portion 5 as well as having a cylindrical form.

The electrode portion 5 has a form obtained vertically dividing a cylindrical conductive member into two parts, having a cross section nearly in H shape, and provided with a extension portion at its middle part for mounting the LED 3 thereon. The concave portion 5A is provided with a slope inside thereof to have an aperture being increased upward, and the reflective surface 5B is formed on the slope.

Effects of the Second Embodiment

The effects of the second embodiment are as follows.

In the second embodiment, since the electrode portion 5 has four functions as electrode, mirror, heat radiator and mount portion for the LED 3, the light emitting device can be downsized.

The concave portion 5A of the electrode portion 5 is provided with the reflective surface 5B, the light extraction efficiency of the light emitting device 1 can be enhanced.

The reflective surface 5B of the embodiment can be made regardless of limitations as described below. Namely, in the conventional case where the electrical connection is made by wire bonding, reliability lowers due to expansion of resin when the length of wire is too long and the manufacturing cost is increased. Further, it is difficult to make a reflective surface with a large solid angle to the LED element 31 since an excessive vertical gap at bonding portion causes a problem in manufacture.

The other effects of the second embodiment are the same as obtained in the first embodiment.

Third Embodiment

Figure 3:
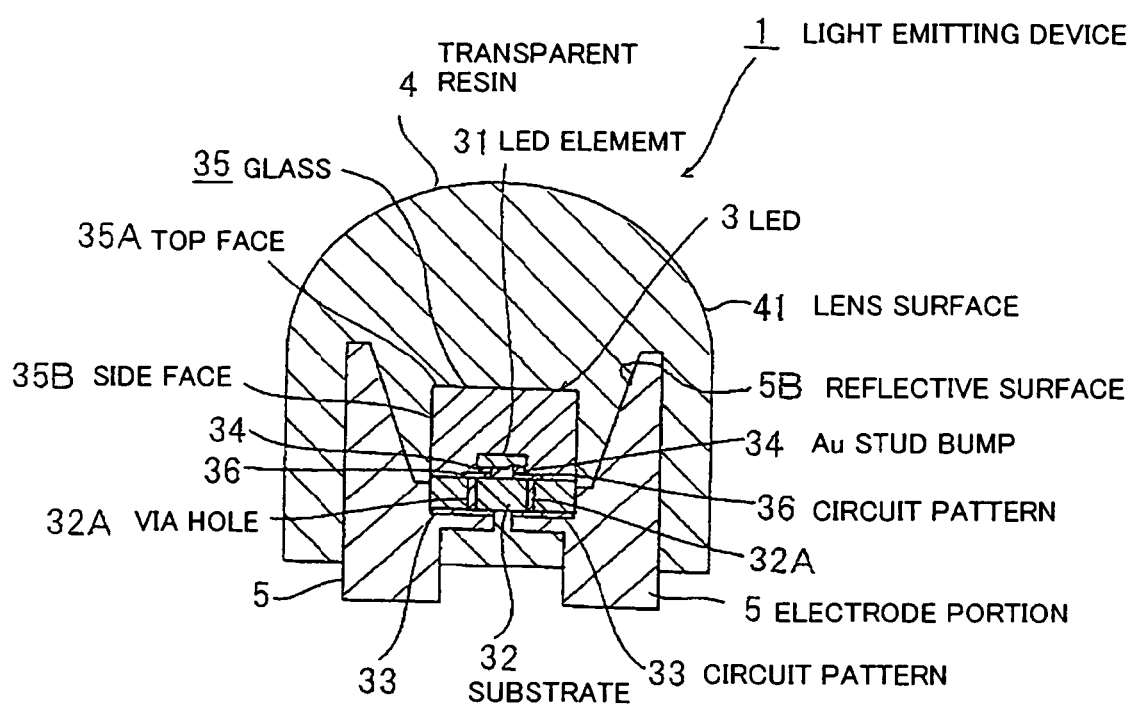
FIG. 3 is a cross sectional view showing a light emitting device in a third preferred embodiment according to the invention.

FIG. 3 is a cross sectional view showing a light emitting device in the third preferred embodiment according to the invention.

The light emitting device of the third embodiment is different from that of the second embodiment in that the transparent resin 4 to cover the LED 3 and the electrode portion 5 is formed of a lamp type as in the first embodiment.

Thus, the light emitting device 1 can have simultaneously optical systems of the lens surface and the reflective surface. In this case, the lens surface is needed to have a size that allows an effective optical surface not only to the LED element 31 and but also to the reflective surface 5B. This can be effected easy and at a low cost since it is sealed with the resin.

The other structural features of the third embodiment are the same as in the second embodiment.

Effects of the Third Embodiment

The effects of the third embodiment are as follows.

Since the transparent resin 4 is formed of the lamp type in the third embodiment, light from the LED 3 can be collected.

The other effects of the third embodiment are the same as obtained in the second embodiment.

Fourth Embodiment

Figure 4:
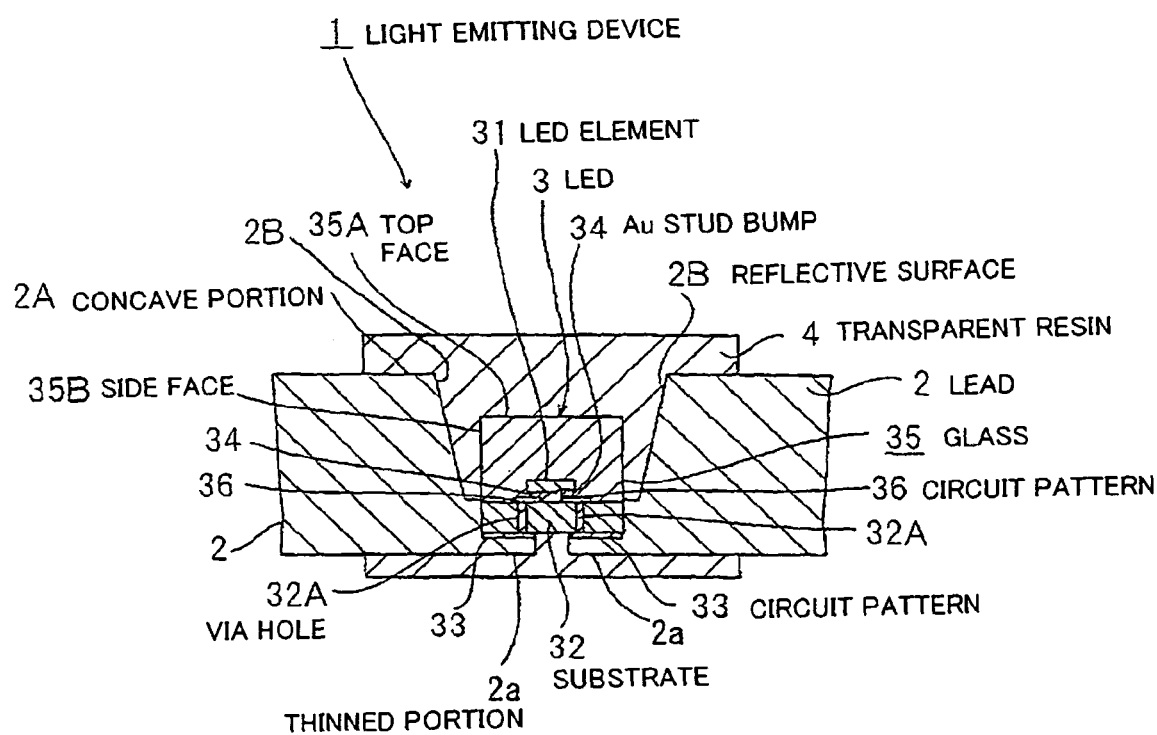
FIG. 4 is a cross sectional view showing a light emitting device in a fourth preferred embodiment according to the invention.

FIG. 4 is a cross sectional view showing a light emitting device in the fourth preferred embodiment according to the invention.

The light emitting device of the fourth embodiment is different from that of the second embodiment in that the horizontal-drawn lead 2 of the first embodiment is used in place of the electrode portion 5 of the second embodiment, and the lead 2 is increased in thickness as well as forming a concave portion 2A like the concave portion 5A and is provided with a reflective surface 2B on the inside face of the concave portion 2A. The other structural features of the fourth embodiment are the same as in the second embodiment.

Effects of the Fourth Embodiment

The effects of the fourth embodiment are as follows.

Since the LED 3 is mounted on the lead 2 with the reflective surface 2B, light from the LED 3 can be reflected on the reflective surface 2B. Thereby, the light extraction efficiency of the light emitting device 1 can be enhanced.

The other effects of the fourth embodiment are the same as obtained in the second embodiment.

Fifth Embodiment

Figure 5:
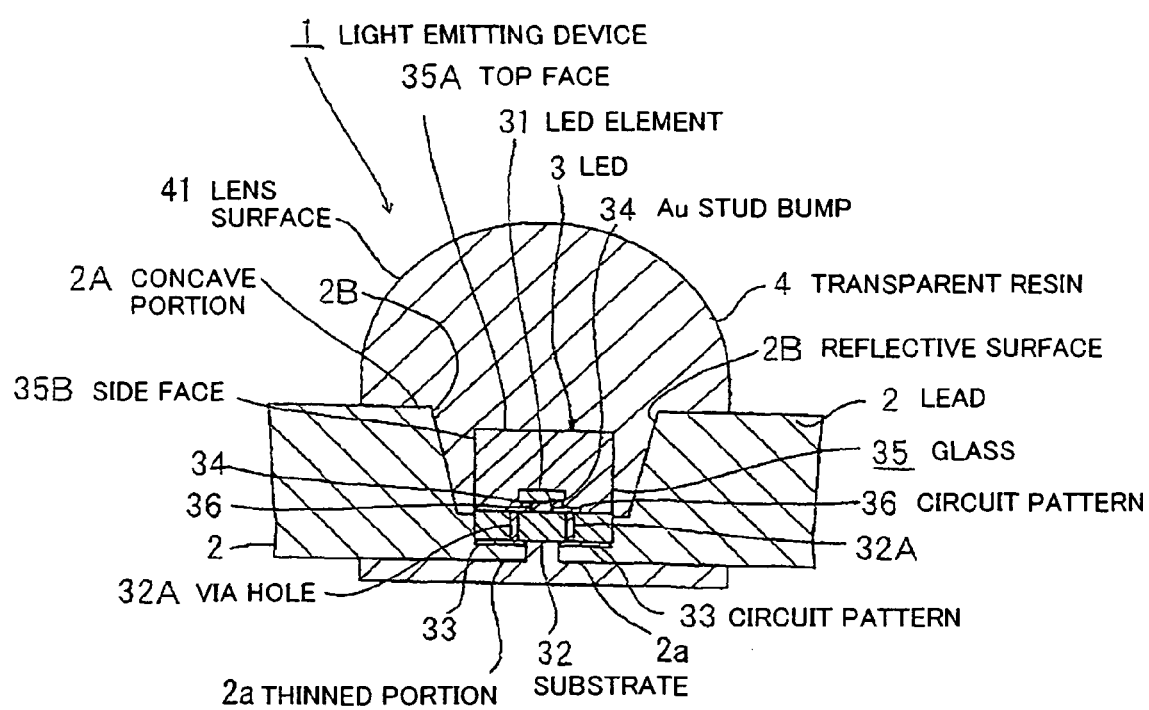
FIG. 5 is a cross sectional view showing a light emitting device in a fifth preferred embodiment according to the invention.

FIG. 5 is a cross sectional view showing a light emitting device in the fifth preferred embodiment according to the invention.

The light emitting device of the fifth embodiment is different from that of the fourth embodiment in that the transparent resin 4 is formed of a lamp type as in the first embodiment to have a lens surface 41 on its top.

The other structural features of the fifth embodiment are the same as in the fourth embodiment.

Effects of the Fifth Embodiment

The effects of the fifth embodiment are as follows.

Since the transparent resin 4 is formed of the lamp type as in the first embodiment, light from the LED 3 can be collected or scattered.

The other effects of the fifth embodiment are the same as obtained in the fourth embodiment.

Sixth Embodiment

Figure 6:
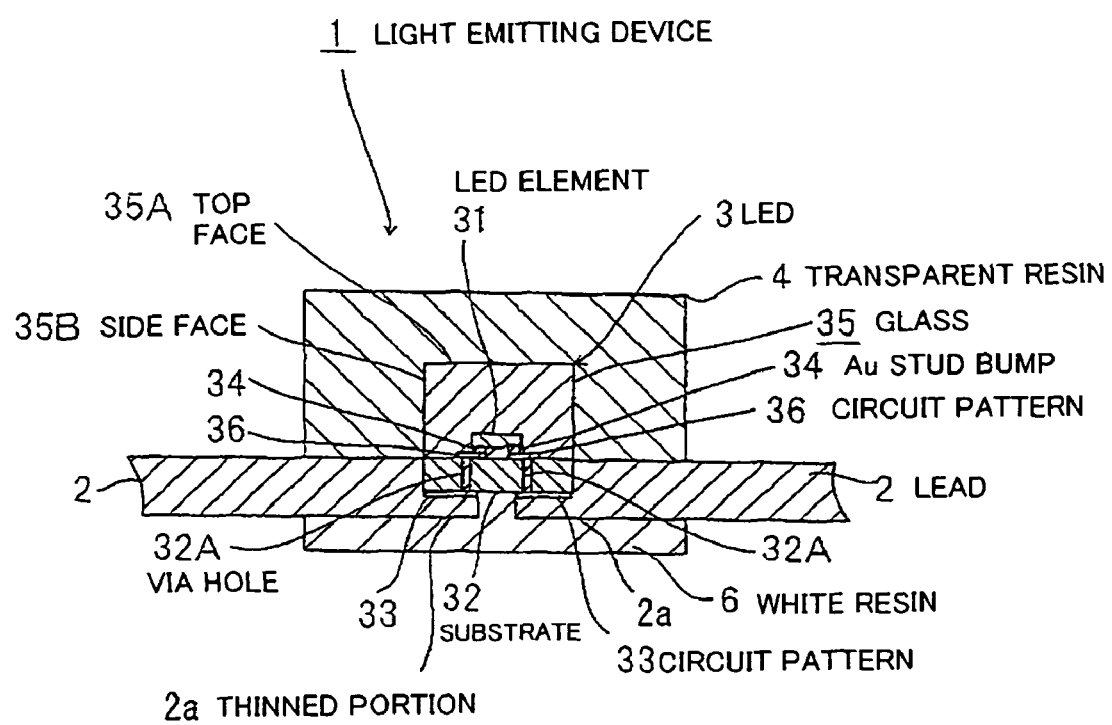
FIG. 6 is a cross sectional view showing a light emitting device in a sixth preferred embodiment according to the invention.

FIG. 6 is a cross sectional view showing a light emitting device in the sixth preferred embodiment according to the invention.

The light emitting device of the sixth embodiment is different from that of the first embodiment in that the transparent resin 4 of the first embodiment is formed of a cylindrical shape with a flat portion on its top on the lead 2 and a white resin 6 with high reflectivity is provided on the bottom of the transparent resin 4 to cover the lower surface of the lead 2.

The other structural features of the sixth embodiment are the same as in the first embodiment.

Effects of the Sixth Embodiment

The effects of the sixth embodiment are as follows.

Light radiated downward from the LED 3 or light reflected downward at the interface between the transparent resin 4 and outside thereof can be upward reflected by the white resin 6. Therefore, the light extraction efficiency of the light emitting device 1 can be enhanced because of preventing light radiated in directions not effective.

By using injection molding with multiple colors, the molding of two kinds of resins can be conducted while setting the leads with the LED 3 mounted thereon. Therefore, the mass productivity thereof can be enhanced.

The other effects of the sixth embodiment are the same as obtained in the first embodiment.

Seventh Embodiment

Figure 7A:
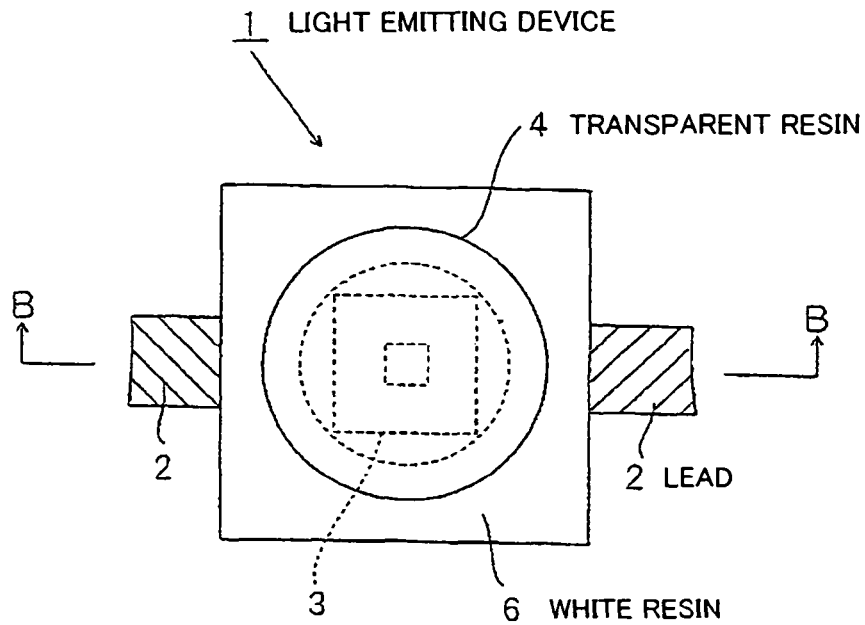
FIG. 7A is a plain view showing a light emitting device in a seventh preferred embodiment according to the invention.
Figure 7B:
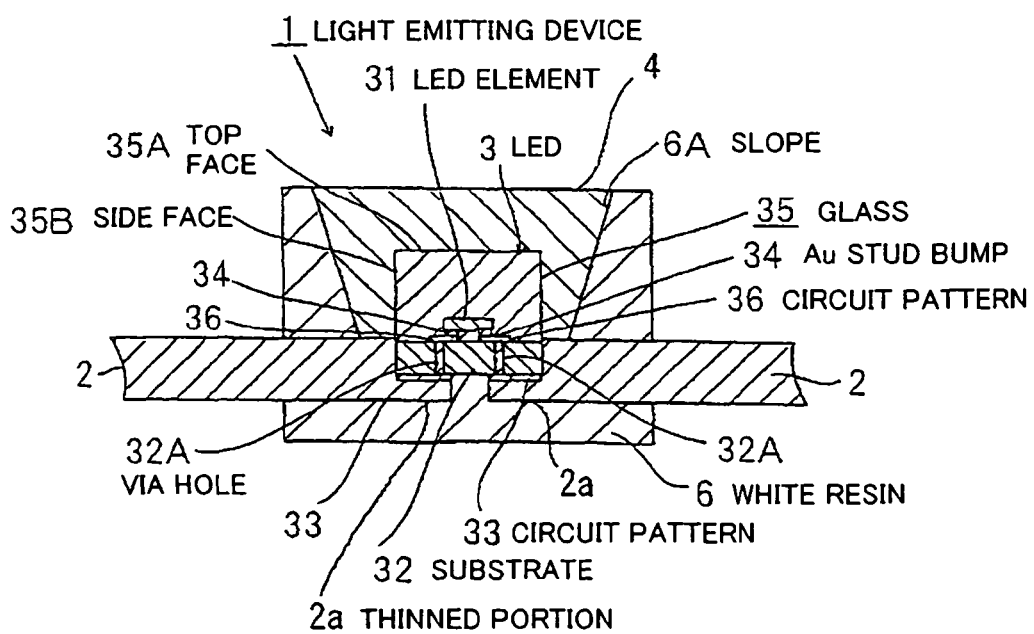
FIG. 7B is a cross sectional view cut along a line B-B in FIG. 7A.

FIG. 7A is a plain view showing a light emitting device in the seventh preferred embodiment according to the invention. FIG. 7B is a cross sectional view cut along a line B-B in FIG. 7A.

The light emitting device of the seventh embodiment is different from that of the sixth embodiment in that the transparent resin 4 of the sixth embodiment is formed to have a small diameter, and the white resin 6 is vertically formed such that it extends over outside of the transparent resin 4 and is provided with a slope 6A on the inside surface thereof facing the LED 3.

The other structural features of the seventh embodiment are the same as in the first embodiment.

Effects of the Seventh Embodiment

The effects of the seventh embodiment are as follows.

Since light from the LED 3 can be reflected on the bottom and side faces of the white resin 6, the light extraction efficiency of the light emitting device 1 can be enhanced.

The other effects of the seventh embodiment are the same as obtained in the sixth embodiment.

Eighth Embodiment

Figure 8:
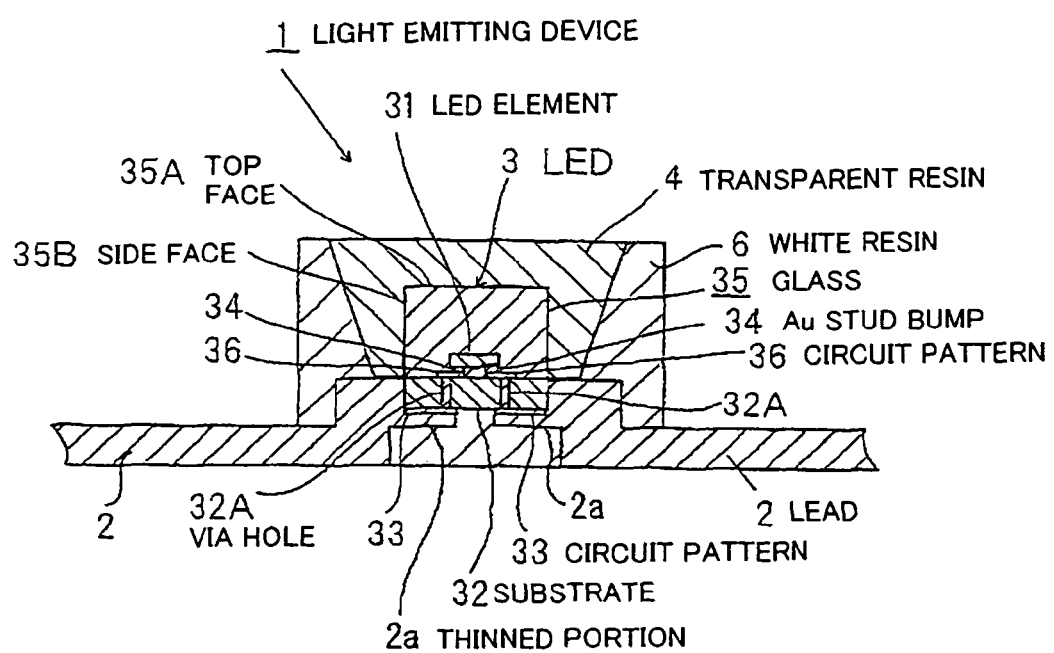
FIG. 8 is a cross sectional view showing a light emitting device in an eighth preferred embodiment according to the invention.

FIG. 8 is a cross sectional view showing a light emitting device in the eighth preferred embodiment according to the invention.

The light emitting device of the eighth embodiment is different from that of the seventh embodiment in that a drawn portion of the lead 2 is bent to have the same plane as the bottom of the white resin 6.

The other structural features of the eighth embodiment are the same as in the seventh embodiment.

Effects of the Eighth Embodiment

The effects of the eighth embodiment are as follows.

Since the drawn portion of the lead 2 has the same plane as the bottom of the white resin 6, it is easy to mount on an external substrate etc.

The LED 3 only has to be mounted on the lead 2 through solder. Thus, the thermal pressure-bonding using ultrasonic simultaneously as in the conventional technique is not needed. Therefore, a failure that ultrasonic is absorbed in the resin portion a little hardened by heat can be avoided. Thereby, mounting to housings with various structures can be conducted in high freedom.

The other effects of the eighth embodiment are the same as obtained in the seventh embodiment.

Ninth Embodiment

Figure 9:
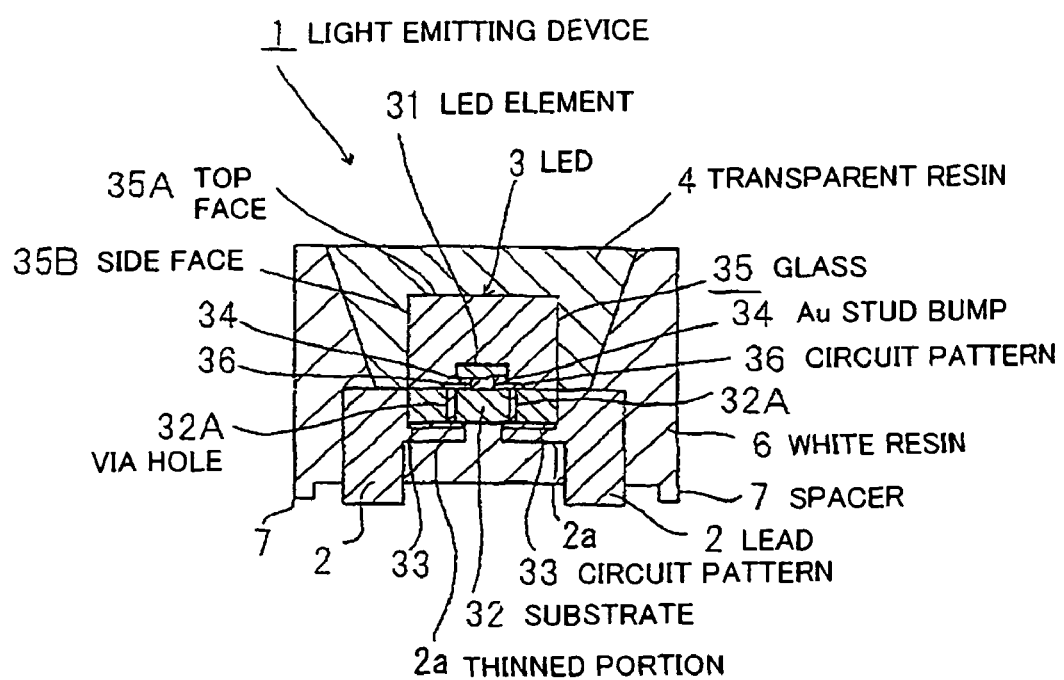
FIG. 9 is a cross sectional view showing a light emitting device in a ninth preferred embodiment according to the invention.

FIG. 9 is a cross sectional view showing a light emitting device in the ninth preferred embodiment according to the invention.

The light emitting device of the ninth embodiment is different from that of the seventh embodiment in that the LED 3 is mounted through solder on the lead 2 drawn in the bottom direction, resin molding is formed by the transparent resin 4 and the white resin 6, and a spacer 7 in ring form is provided outside of the bottom of the white resin 6 to have a height protruding from the bottom face when cutting the leads 2.

The other structural features of the ninth embodiment are the same as in the seventh embodiment.

Effects of the Ninth Embodiment

The effects of the ninth embodiment are as follows.

Since the lower end of the drawn portion of the lead 2 protrudes from the bottom face of the white resin 6, the surface mounting on an external substrate etc. can be attained.

Further, with the spacer 7, the stability of the light emitting device 1 can be developed even when having the protruded leads.

Since the spacer 7 can be simultaneously formed in the injection molding of the white resin 6, the additional function can be given without increasing the number of components and without requiring the trouble in mounting thereof.

The light emitting device 1 thus constructed can have such a waterproof structure that the pattern or lead on the substrate 32 is not exposed by disposing the plural devices on the substrate 32 and sealing the side of the light emitting device 1 with the resin. In this case, it is advantageous for the waterproof resin sealing that the lead 2 protrudes from the bottom face of the white resin 6.

The other effects of the ninth embodiment are the same as obtained in the seventh embodiment.

Tenth Embodiment

Figure 10:
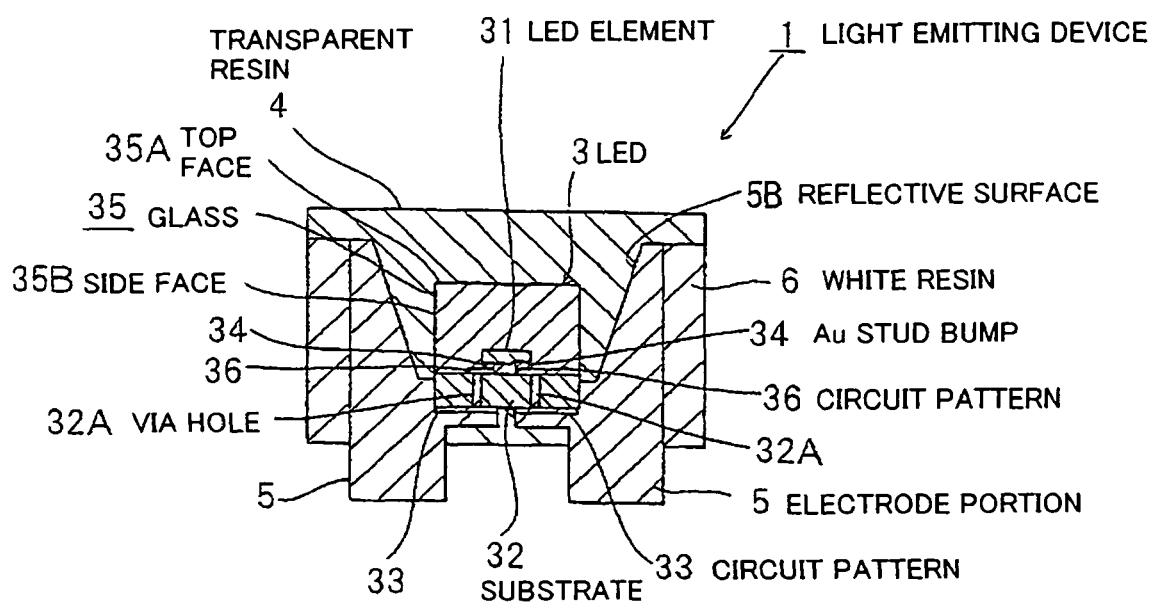
FIG. 10 is a cross sectional view showing a light emitting device in a tenth preferred embodiment according to the invention.

FIG. 10 is a cross sectional view showing a light emitting device in the tenth preferred embodiment according to the invention.

The light emitting device of the tenth embodiment is different from that of the second embodiment in that the white resin 6 is provided surrounding the upper portion of the electrode portion 5, and the transparent resin 4 is formed extended outward at the top end of the white resin 6.

The other structural features of the tenth embodiment are the same as in the second embodiment.

Effects of the Tenth Embodiment

The effects of the tenth embodiment are as follows.

Light emitted from the LED element 31 can be externally radiated by the direct reflection of the reflective surface 5B.

Light reflected downward at the interface of the transparent resin 4 and the outside thereof can be reflected upward by the white resin 6 to reduce light radiated in a direction not effective. Thus, the light extraction efficiency of the light emitting device 1 can be enhanced. Meanwhile, when the reflective surface 5B is formed into a paraboloid of revolution with the LED element 31 as a focal point thereof, light distribution property with high light collecting power can be obtained.

The other effects of the tenth embodiment are the same as obtained in the second embodiment.

Eleventh Embodiment

Figure 11:
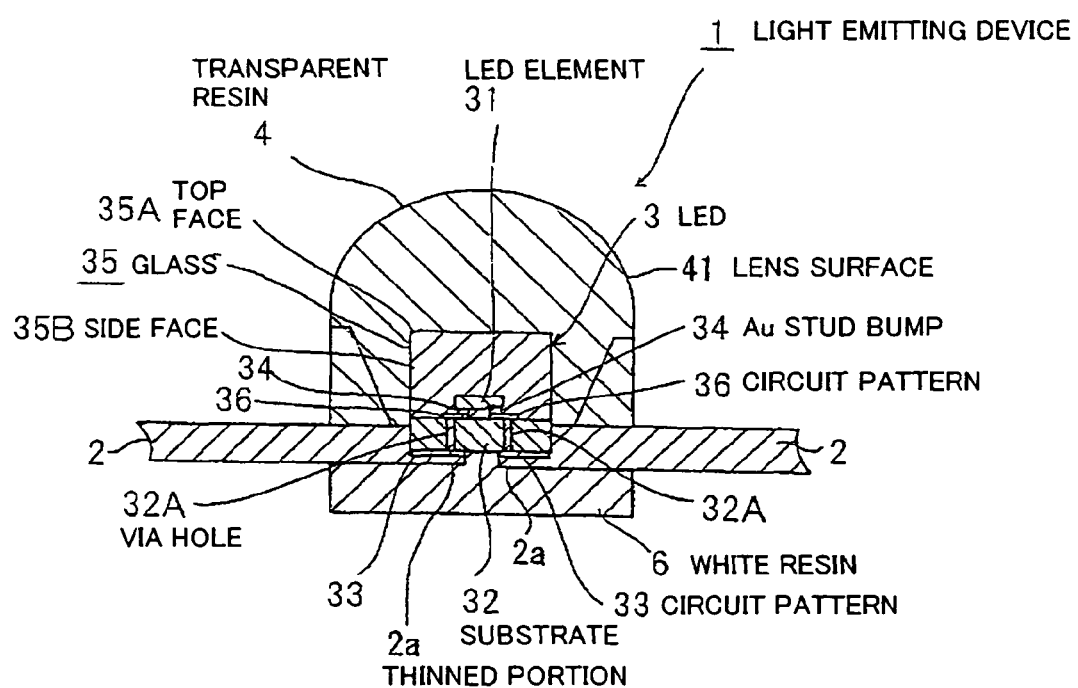
FIG. 11 is a cross sectional view showing a light emitting device in an eleventh preferred embodiment according to the invention.

FIG. 11 is a cross sectional view showing a light emitting device in the eleventh preferred embodiment according to the invention.

The light emitting device of the eleventh embodiment is different from that of the first embodiment in that the white resin 6 as described in the seventh embodiment is provided under the lamp-type transparent resin 4.

The other structural features of the eleventh embodiment are the same as in the first embodiment.

Effects of the Eleventh Embodiment

The effects of the eleventh embodiment are as follows.

Light emitted downward or sideward from the LED element 31 can be reflected by the white resin 6 and most of light can be radiated within 60 degrees relative to the central axis of the LED element 31 by the convex transparent resin 4.

The other effects of the eleventh embodiment are the same as obtained in the first embodiment.

Twelfth Embodiment

Figure 12:
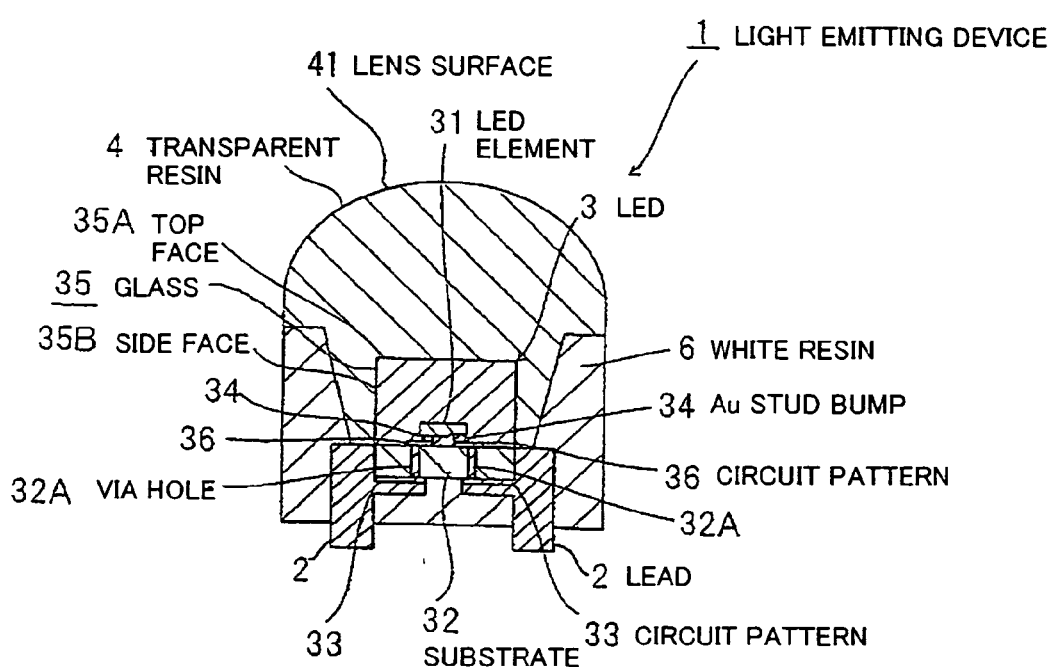
FIG. 12 is a cross sectional view showing a light emitting device in a twelfth preferred embodiment according to the invention.

FIG. 12 is a cross sectional view showing a light emitting device in the twelfth preferred embodiment according to the invention.

The light emitting device of the twelfth embodiment is different from that of the ninth embodiment in that the transparent resin 4 is provided with the lens surface 41.

The other structural features of the twelfth embodiment are the same as in the ninth embodiment.

Effects of the Twelfth Embodiment

The effects of the twelfth embodiment are as follows.

The light emitting device with the lens surface 41 can be surface-mounted on an external substrate etc.

In the conventional techniques, when mounting the LED element 31 on the substrate and soldering the light emitting device 1 by reflowing, the soldering by reflowing can be conducted for a lens diameter of about $\phi 3$. However, for a large lens diameter of $\phi 4$ or $\phi 5$, disconnection of wire may be caused by the thermal expansion of the resin. In contrast, in this embodiment, even for a large size greater than $\phi 4$ to offer a sufficient lens effect, the solder by reflowing can be conducted since the electrical connection is not affected by the thermal expansion of the resin. Meanwhile, in the reflowing, it is necessary to select the transparent resin 4 durable at the reflow temperature.

The other effects of the twelfth embodiment are the same as obtained in the ninth embodiment.

Thirteenth Embodiment

Figure 13:
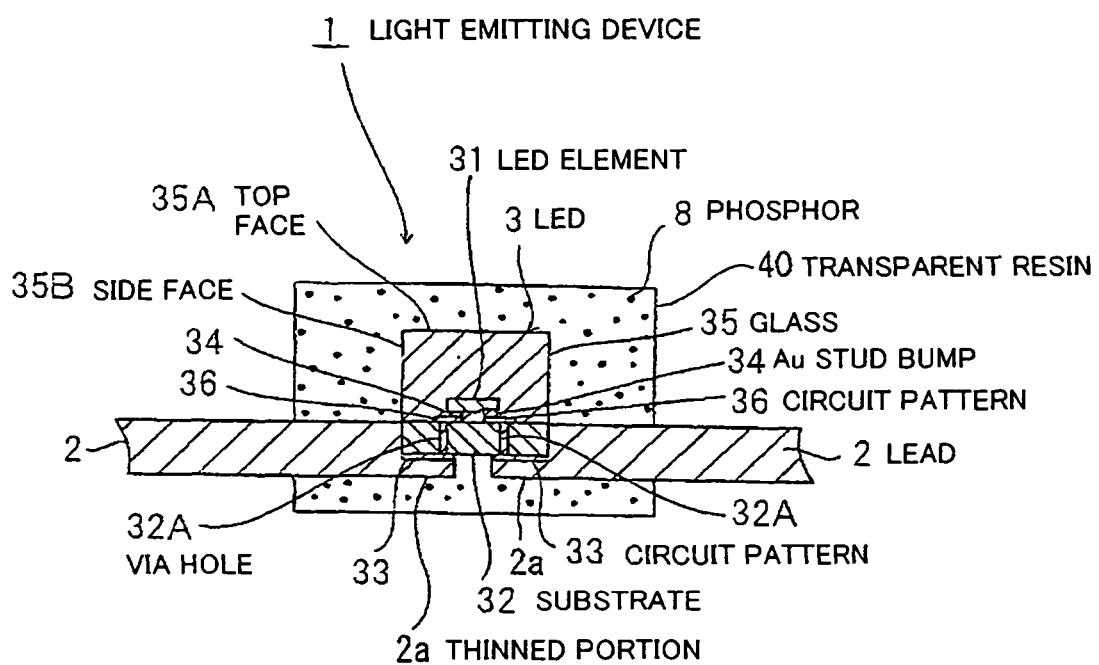
FIG. 13 is a cross sectional view showing a light emitting device in a thirteenth preferred embodiment according to the invention.

FIG. 13 is a cross sectional view showing a light emitting device in the thirteenth preferred embodiment according to the invention.

The light emitting device of the thirteenth embodiment is different from that of the sixth embodiment in that a transparent resin 40 contains a phosphor.

The phosphor 8 may be YAG (yttrium aluminum garnet), silicate phosphor, or a mixture thereof. The phosphor 8 is composed of one kind or plural kinds of phosphors. For example, a combination of plural kinds of phosphors is a phosphor to radiate red light, a phosphor to radiate green light and a phosphor to radiate blue light.

The other structural features of the thirteenth embodiment are the same as in the sixth embodiment.

Effects of the Thirteenth Embodiment

The effects of the thirteenth embodiment are as follows.

With the transparent resin 40 containing the phosphor 8, wavelength conversion is conducted by the phosphor 8. For example, when the phosphor 8 is composed of a red phosphor, a green phosphor and a blue phosphor, ultraviolet light emitted from the LED 3 is wavelength-converted by the phosphor 8 and secondary light radiated therefrom is mixed with primary light emitted from the LED 3 to generate visible light. Thus, even when the emission wavelength of the LED 3 varies, the light emitting device 1 can be constant in emission color tone.

The phosphor 8 has a relative density several times higher than resins and its density depends on kind of radiated color. For example, one of red phosphors can have a relative density of 6 which is significantly greater than typical phosphors. In the conventional techniques, since resin molding is conducted at a low viscosity, it takes a long time to cure a thermosetting resin. Therefore, phosphor contained therein may be deposited and the light extraction efficiency or emission color may be affected thereby.

In the invention, since the phosphor 8 is instantly injected while being agitated and then cured into a given form, it can be uniformly spread without deposition in the transparent resin 40.

The other effects of the thirteenth embodiment are the same as obtained in the sixth embodiment.

Fourteenth Embodiment

Figure 14:
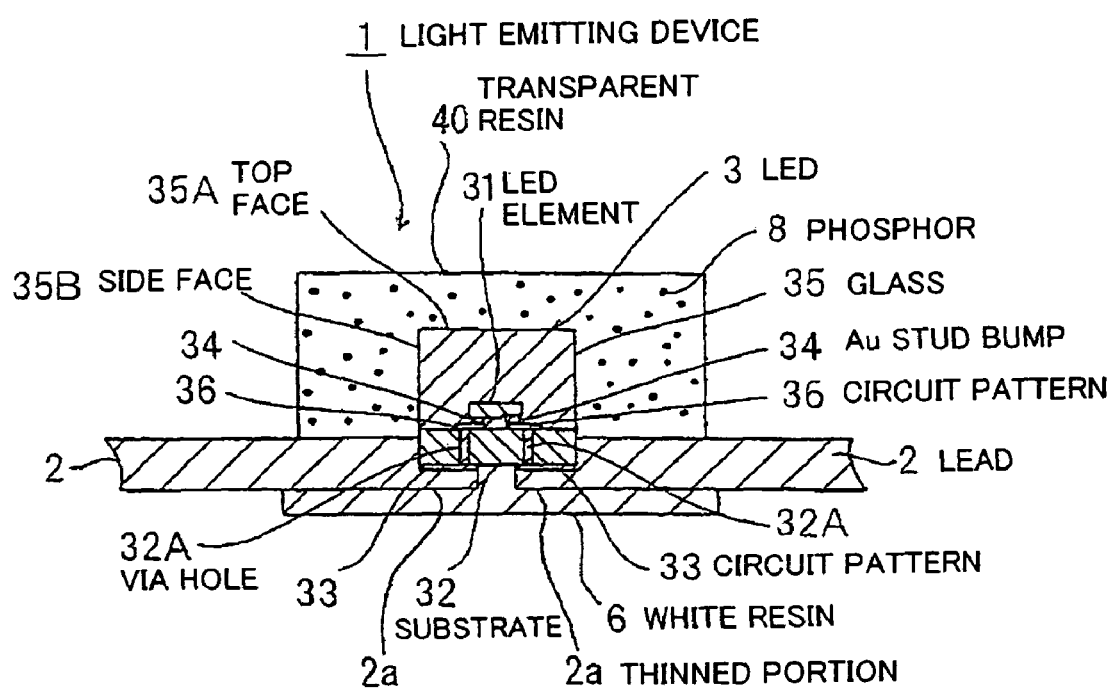
FIG. 14 is a cross sectional view showing a light emitting device in a fourteenth preferred embodiment according to the invention.

FIG. 14 is a cross sectional view showing a light emitting device in the fourteenth preferred embodiment according to the invention.

The light emitting device of the fourteenth embodiment is different from that of the thirteenth embodiment in that the transparent resin 4 is replaced by the white resin 6 at a part lower than the lead 2.

The other structural features of the fourteenth embodiment are the same as in the thirteenth embodiment.

Effects of the Fourteenth Embodiment

The effects of the fourteenth embodiment are as follows.

By the white resin 6, light emitted downward from the LED 3 and light wavelength-converted by the phosphor 8 can be reflected upward. Thereby, light to be radiated in a direction not effective can be reduced and the light emitting device 1 can have enhanced light extraction efficiency.

The other effects of the fourteenth embodiment are the same as obtained in the thirteenth embodiment.

Fifteenth Embodiment

Figure 15:
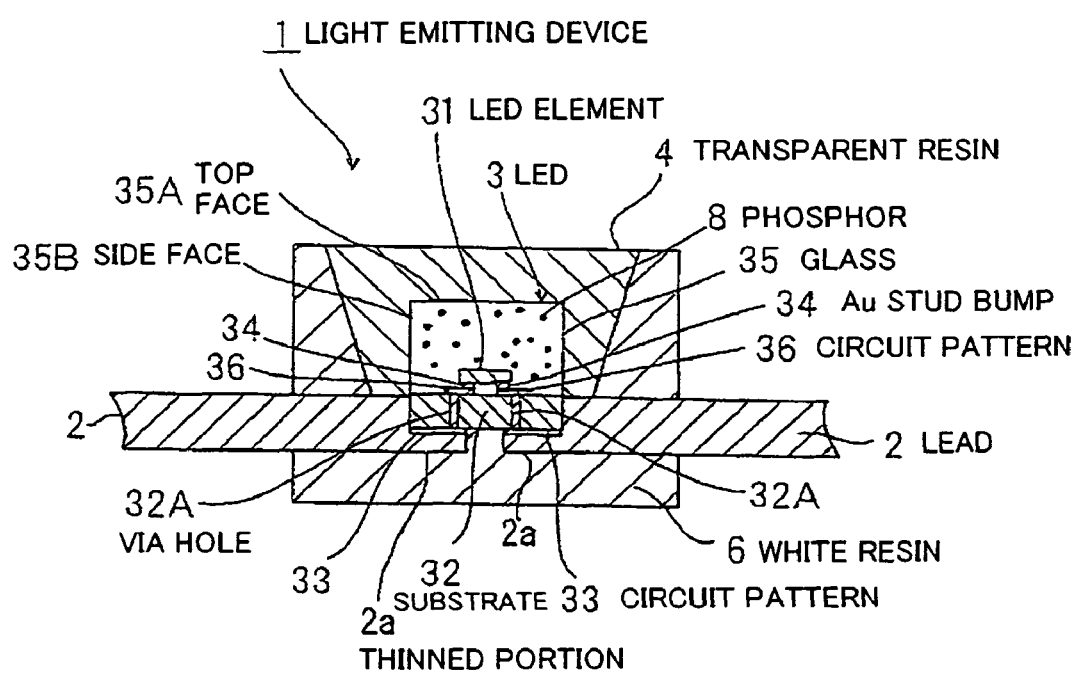
FIG. 15 is a cross sectional view showing a light emitting device in a fifteenth preferred embodiment according to the invention.

FIG. 15 is a cross sectional view showing a light emitting device in the fifteenth preferred embodiment according to the invention.

The light emitting device of the fifteenth embodiment is different from that of the seventh embodiment in that the glass 35 of the LED 3 contains the phosphor 8.

The other structural features of the fifteenth embodiment are the same as in the seventh embodiment.

Effects of the Fifteenth Embodiment

The effects of the fifteenth embodiment are as follows.

The phosphor 8 contained in the glass 35 of the LED 3 can absorb primary light from the LED 3 and then radiate visible light. Therefore, even when the emission wavelength of the LED 3 varies, the light emitting device 1 can be constant in emission color tone.

The other effects of the fifteenth embodiment are the same as obtained in the seventh embodiment.

Sixteenth Embodiment

Figure 16:
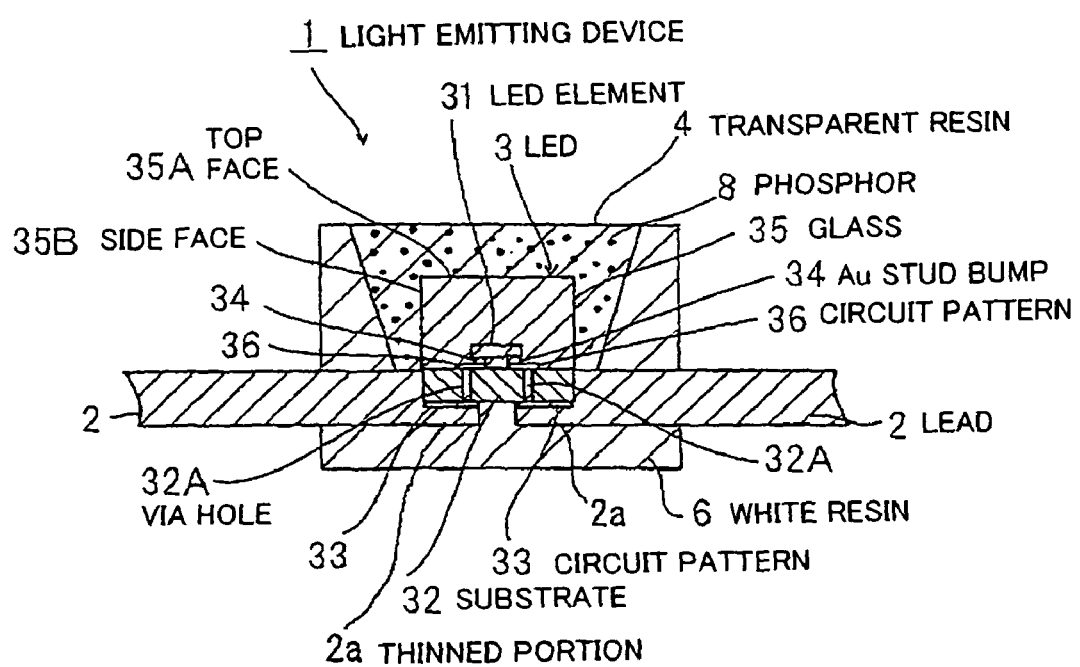
FIG. 16 is a cross sectional view showing a light emitting device in a sixteenth preferred embodiment according to the invention.

FIG. 16 is a cross sectional view showing a light emitting device in the sixteenth preferred embodiment according to the invention.

The light emitting device of the sixteenth embodiment is different from that of the seventh embodiment in that the transparent resin 4 contains the phosphor 8.

The other structural features of the sixteenth embodiment are the same as in the seventh embodiment.

Effects of the Sixteenth Embodiment

The effects of the sixteenth embodiment are as follows.

The phosphor 8 contained in the transparent resin 4 can absorb primary light from the LED 3 and then radiate visible light. Therefore, even when the emission wavelength of the LED 3 varies, the light emitting device 1 can be constant in emission color tone.

The other effects of the sixteenth embodiment are the same as obtained in the seventh embodiment.

Seventeenth Embodiment

Figure 17:
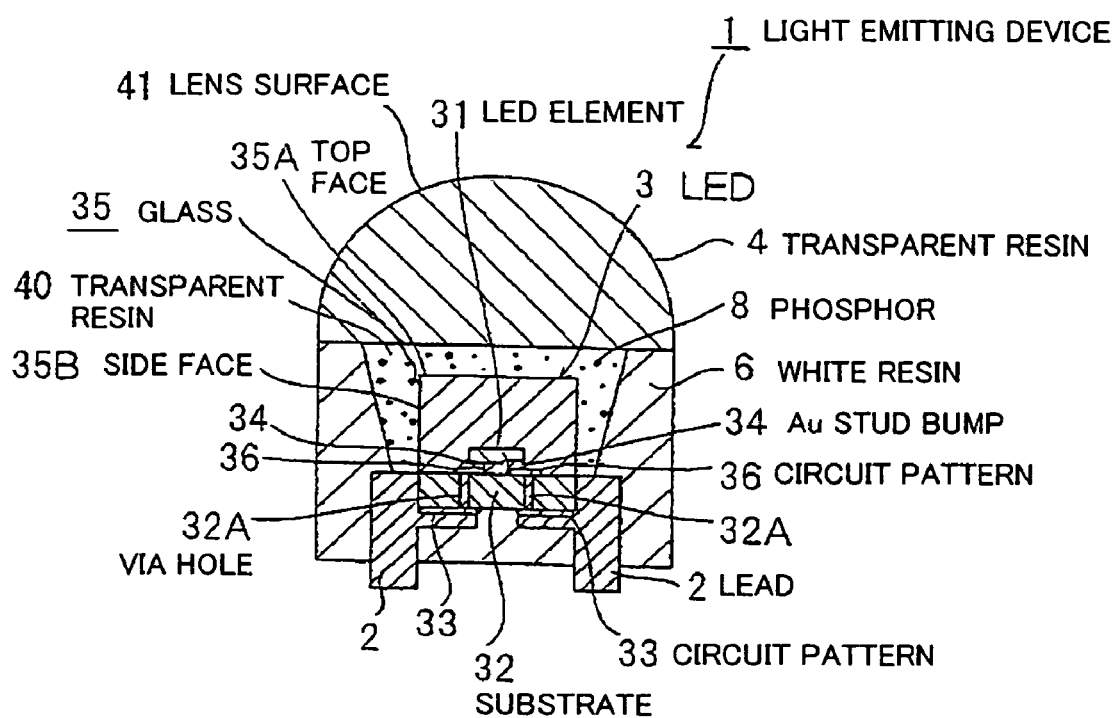
FIG. 17 is a cross sectional view showing a light emitting device in a seventeenth preferred embodiment according to the invention.

FIG. 17 is a cross sectional view showing a light emitting device in the seventeenth preferred embodiment according to the invention.

The light emitting device of the seventeenth embodiment is different from that of the twelfth embodiment in that the transparent resin 40 is filled inside of the white resin 6 and it contains the phosphor 8. The transparent resin 4 is formed on the white resin 6 and the transparent resin 40.

The other structural features of the seventeenth embodiment are the same as in the twelfth embodiment.

Effects of the Seventeenth Embodiment

The effects of the seventeenth embodiment are as follows.

The phosphor 8 contained in the transparent resin 40 can absorb primary light from the LED 3 and then radiate visible light. Therefore, even when the emission wavelength of the LED 3 varies, the light emitting device 1 can be constant in emission color tone.

The other effects of the seventeenth embodiment are the same as obtained in the twelfth embodiment.

Eighteenth Embodiment

Figure 18A:
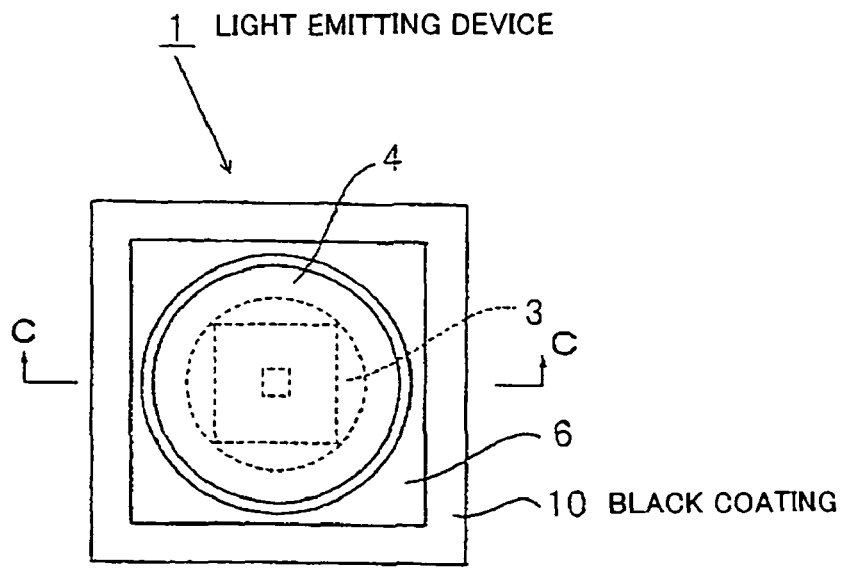
FIG. 18A is a plain view showing a light emitting device in an eighteenth preferred embodiment according to the invention.
Figure 18B:
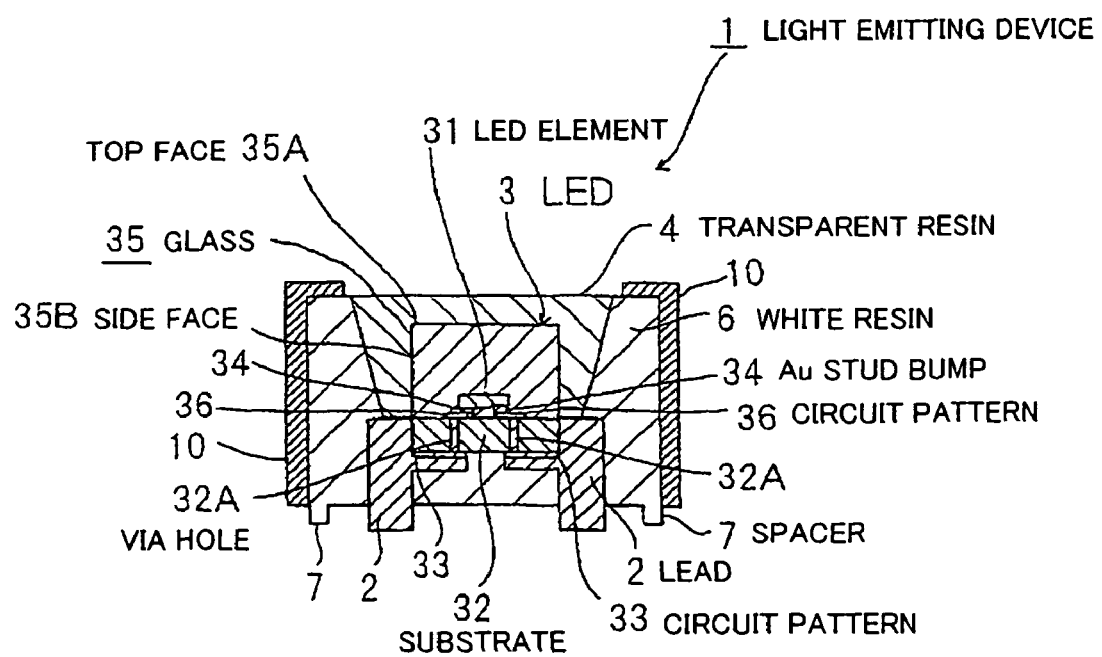
FIG. 18B is a cross sectional view cut along a line C-C in FIG. 18A.

FIG. 18A is a plain view showing a light emitting device in the eighteenth preferred embodiment according to the invention. FIG. 18B is a cross sectional view cut along a line C-C in FIG. 18A.

The light emitting device of the eighteenth embodiment is different from that of the ninth embodiment in that a black coating 10 is provided on the outside face and top face of the white resin 6. The black coating 10 may be replaced by black resin etc provided on the faces.

The other structural features of the eighteenth embodiment are the same as in the ninth embodiment.

Effects of the Eighteenth Embodiment

The effects of the eighteenth embodiment are as follows.

When plural light emitting devices 1 are arrayed, there is a problem that a light emitting device 1 being turned off appears to be turned on due to external light or light of a light emitting device 1 being turned on nearby. By the black coating 10, this problem can be solved.

The other effects of the eighteenth embodiment are the same as obtained in the ninth embodiment.

Nineteenth Embodiment

Figure 19:
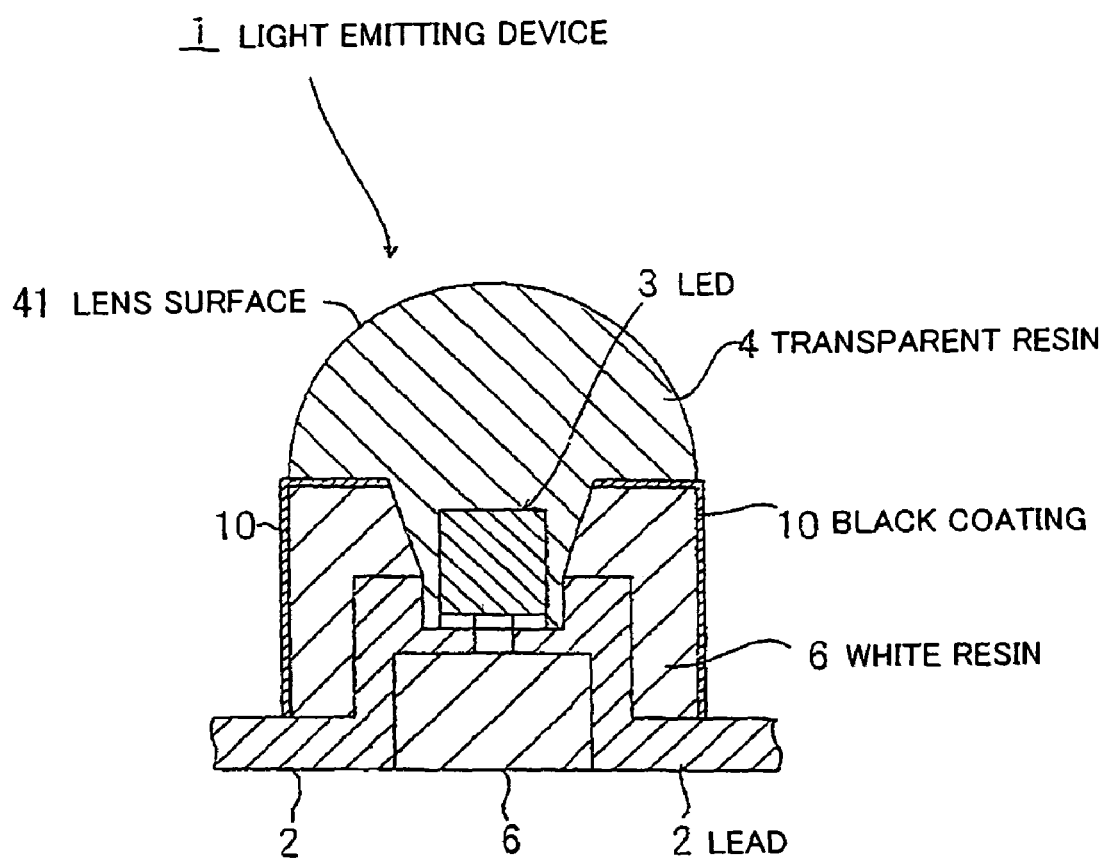
FIG. 19 is a cross sectional view showing a light emitting device in a nineteenth preferred embodiment according to the invention.

FIG. 19 is a cross sectional view showing a light emitting device in the nineteenth preferred embodiment according to the invention.

The light emitting device of the nineteenth embodiment is different from that of the eighth embodiment in that the transparent resin 4 is formed of a lamp type and the black coating 10 is provided on the outside face and top face of the white resin 6.

The other structural features of the nineteenth embodiment are the same as in the eighth embodiment.

Effects of the Nineteenth Embodiment

The effects of the nineteenth embodiment are as follows.

When plural light emitting devices 1 are arrayed, there is a problem that a light emitting device 1 being turned off appears to be turned on due to external light or light of a light emitting device 1 being turned on nearby. By the black coating 10, this problem can be solved.

The other effects of the nineteenth embodiment are the same as obtained in the eighth embodiment.

Twentieth Embodiment

Figure 20:
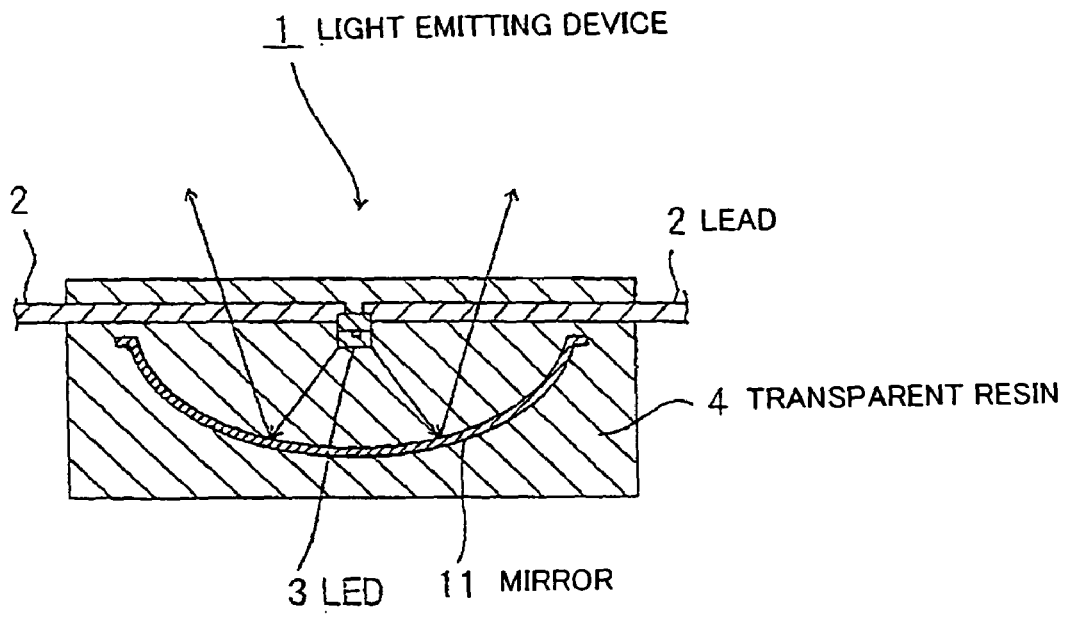
FIG. 20 is a cross sectional view showing a light emitting device in a twentieth preferred embodiment according to the invention.

FIG. 20 is a cross sectional view showing a light emitting device in the twentieth preferred embodiment according to the invention.

The light emitting device of the twentieth embodiment is featured in that it comprises a pair of leads 2, the LED 3 mounted under the opposed portion of the leads 2, and a reflection mirror 11 which is made of an aluminum plate and formed a parabolic surface of revolution with the LED 3 as a focal point thereof and disposed opposite the Led 3, wherein the LED 3, the leads 2 nearby and the mirror 11 are sealed with the transparent resin 4.

Effects of the Twentieth Embodiment

The effects of the twentieth embodiment are as follows.

Almost all of light emitted from the LED 3 can be externally radiated by the optical control of the mirror 11. When the mirror 11 has a large diameter, it is negligible that reflected light of the mirror 11 is blocked by the LED 3 and the leads 2. In this case, however, the conventional device has a problem that disconnection of wire may occur due to thermal expansion of the resin.

In this embodiment, the soldering by reflowing can be conducted with no problem even when the mirror 11 has a sufficient large diameter.

The other effects of the twentieth embodiment are the same as obtained in the first embodiment.

Twenty-First Embodiment

Figure 21:
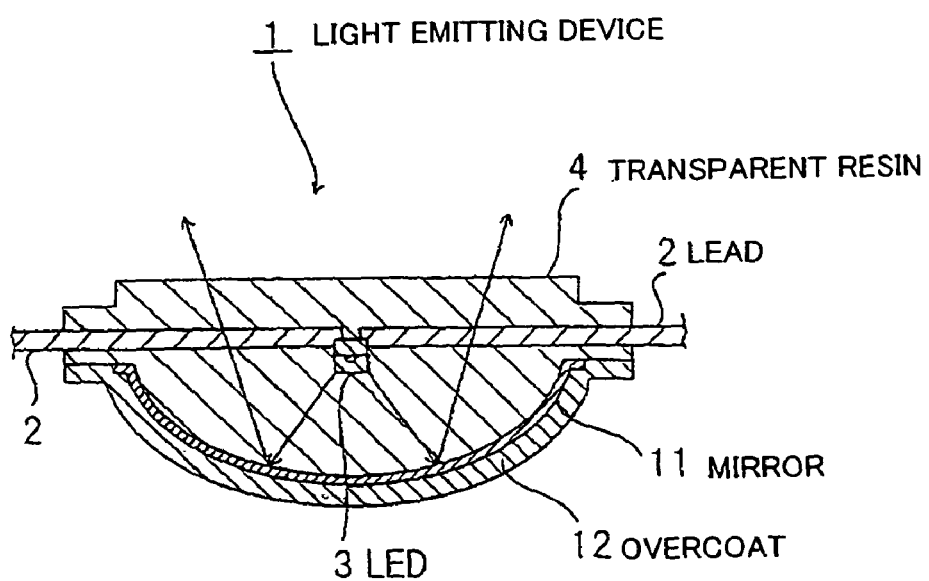
FIG. 21 is a cross sectional view showing a light emitting device in a twenty-first preferred embodiment according to the invention.

FIG. 21 is a cross sectional view showing a light emitting device in the twenty-first preferred embodiment according to the invention.

The light emitting device of the twenty-first embodiment is different from that of the twentieth embodiment in that the transparent resin 4 is formed to cover the LED 3 and the leads 2 nearby the LED 3 and to have a lens-like convex surface, the mirror 11 is disposed on the convex surface and covered with an overcoat 12 made of resin.

The other structural features of the twenty-first embodiment are the same as in the twentieth embodiment.

Effects of the Twenty-First Embodiment

The twenty-first embodiment can have the same effects as the twentieth embodiment.

Twenty-Second Embodiment

Figure 22A:
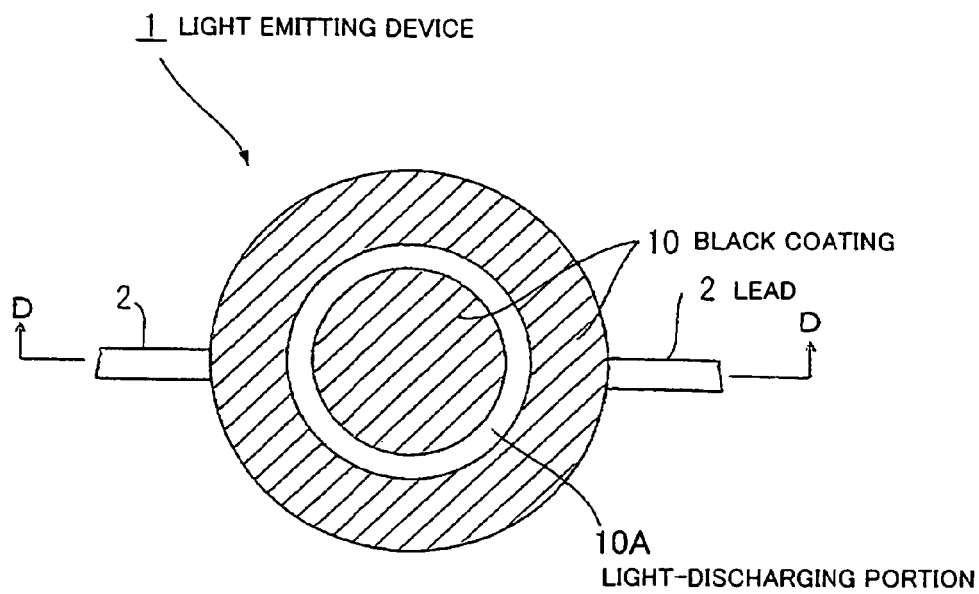
FIG. 22A is a plain view showing a light emitting device in a twenty-second preferred embodiment according to the invention.
Figure 22B:
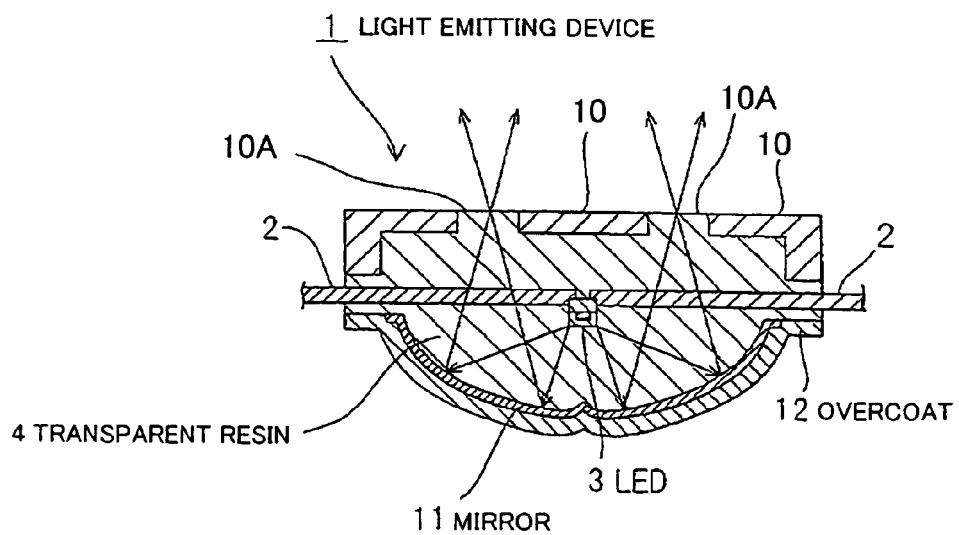
FIG. 22B is a cross sectional view cut along a line D-D in FIG. 22A.

FIG. 22A is a plain view showing a light emitting device in the twenty-second preferred embodiment according to the invention. FIG. 22B is a cross sectional view cut along a line D-D in FIG. 22A.

The light emitting device of the twenty-second embodiment is different from that of the twentieth embodiment in that the convex surface of the transparent resin 4 is formed to be recessed like inverted V at the center to reflect light from the LED 3 to a specific direction. Further, the black coating 10 as a light-blocking portion is formed with a ring-like light-discharging portion 10A on the upper face of the transparent resin 4. The black coating 10 is also formed surrounding the side face of the transparent resin 4. The black coating 10 may be replaced by black resin etc. provided on the faces. The light-discharging portion 10A may be formed into arbitrary form or pattern other than the ring form.

Effects of the Twenty-Second Embodiment

The effects of the twenty-second embodiment are as follows.

Since the black coating 10 is disposed on the light extraction surface and reflected light from the mirror 11 is collected on the light-discharging portion 10A, the reflected light from the mirror 11 passes only through the ring-like light-discharging portion 10A. Therefore, contrast in brightness between turn-on and turn-off can be increased. Thus, the light emitting device 1 of this embodiment is suitable for a display unit etc.

Further, although a light emitting device using an LED is a point source of light, the light emitting device 1 of this embodiment can emit ring-like light and is therefore suitable for decorative purposes.

The other effects of the twenty-second embodiment are the same as obtained in the twenty-first embodiment.

Twenty-Third Embodiment

Figure 23:
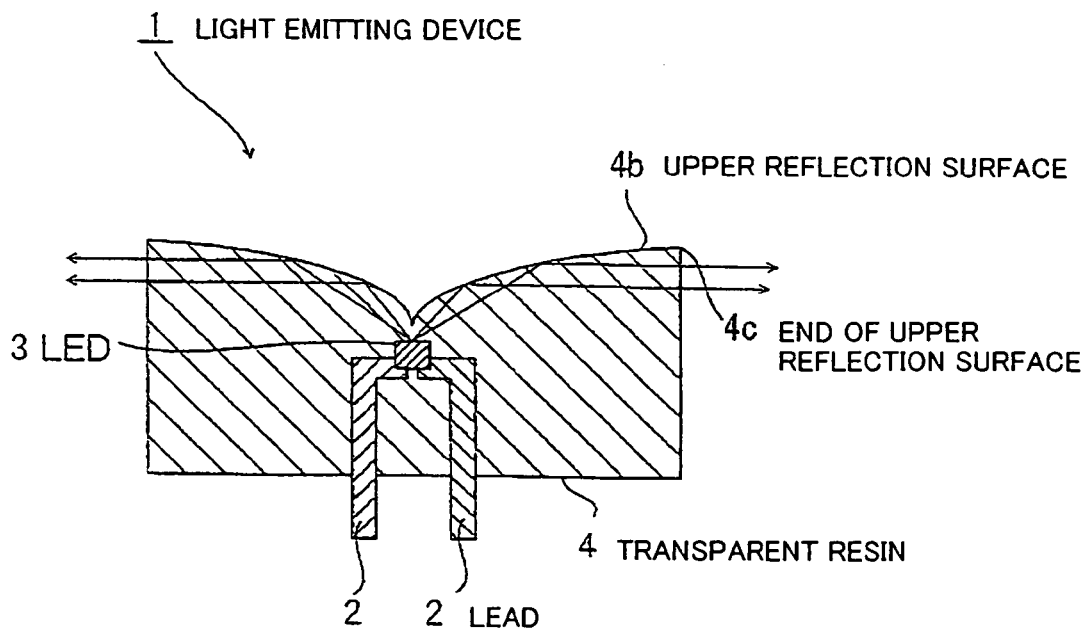
FIG. 23 is a cross sectional view showing a light emitting device in a twenty-third preferred embodiment according to the invention.

FIG. 23 is a cross sectional view showing a light emitting device in the twenty-third preferred embodiment according to the invention.

The light emitting device 1 of the twenty-third embodiment is featured in that it comprises a pair of L-shaped leads 2, LED 3 as shown in FIG. 1B mounted on the tip of a horizontal portion of the leads 2, and transparent resin 4 which seals surrounding the LED 3 and leads 2 nearby as well as forming nearly a cylindrical resin body and is provided with an upper reflection surface 4b on the top face thereof as well as a V-shaped recess at the center thereof. The lower end of the leads 2 extends a given length from the bottom of the transparent resin 4.

Effects of the Twenty-Third Embodiment

The effects of the twenty-third embodiment are as follows.

Most of light from the LED 3 is total-reflected by the upper reflection surface 4b of the transparent resin 4, and externally radiated through the side face of the transparent resin 4. Thus, the light emitting device 1 of this embodiment can be of lateral radiation type.

In this form, the optical control becomes advantageous as the solid angle of the upper reflection surface 4b to the LED 3 increases. Therefore, it is desirable to increase the diameter of the transparent resin 4. The cast molding, which uses plural lead frames and molds in mass production, is disadvantageous for such an increased diameter in productivity aspects of the cost of material, the cost of mold and the number of retrieved products from the mold. The injection molding does not have such a problem.

Further, conventionally, in forming an optical surface with epoxy resin, bubbles may remain therein when the upper reflection surface 4b has an edge and thereby the yield lowers significantly. On the contrary, when the edge of the upper reflection surface 4b is rounded to prevent the generation of bubble, the side radiation efficiency may lower.

In contrast, the injection molding does not develop any bubbles even when forming the edge by pressuring.

Meanwhile, this embodiment can have the same effects on the LED 3 as mentioned in the first embodiment.

Twenty-Fourth Embodiment

Figure 24:
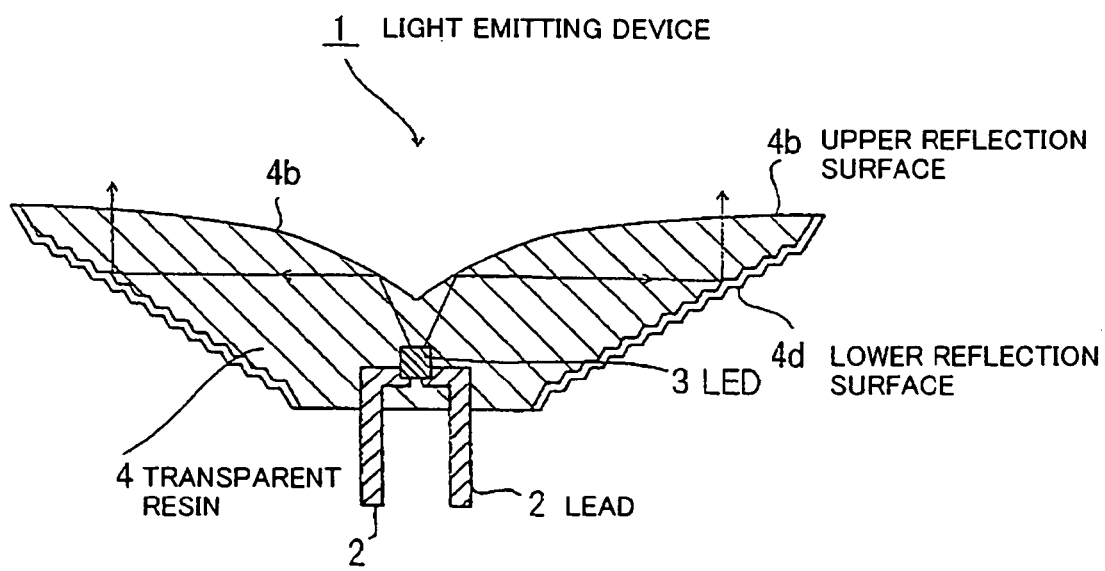
FIG. 24 is a cross sectional view showing a light emitting device in a twenty-fourth preferred embodiment according to the invention.

FIG. 24 is a cross sectional view showing a light emitting device in the twenty-fourth preferred embodiment according to the invention.

The light emitting device 1 of the twenty-fourth embodiment is featured in that the transparent resin 4 of the twenty-third embodiment is provided with a lower reflection surface 4d like a Fresnel lens on the lower face thereof.

Effects of the Twenty-Fourth Embodiment

The effects of the twenty-fourth embodiment are as follows.

With the upper reflection surface 4b on the top face and the lower reflection surface 4d on the lower face, light from the LED 3 is mostly reflected on the upper reflection surface 4b, reaching the lower reflection surface 4d, reflected thereon and then passing through the upper reflection surface 4b to the outside of the transparent resin 4. Thus, the light emitting device 1 can have enhanced light extraction efficiency.

By using the injection molding, the upper and lower surface, which cannot be developed in the conventional cast molding using epoxy resin, i.e., the optical surfaces in the light extraction face direction and the back face direction of the LED element 31 can be easy formed. Meanwhile, the lower reflection surface 4d may be mirror finished or may use the total reflection of the resin.

The other effects of the twenty-fourth embodiment are the same as obtained in the twenty-third embodiment.

Twenty-Fifth Embodiment

Figure 25:
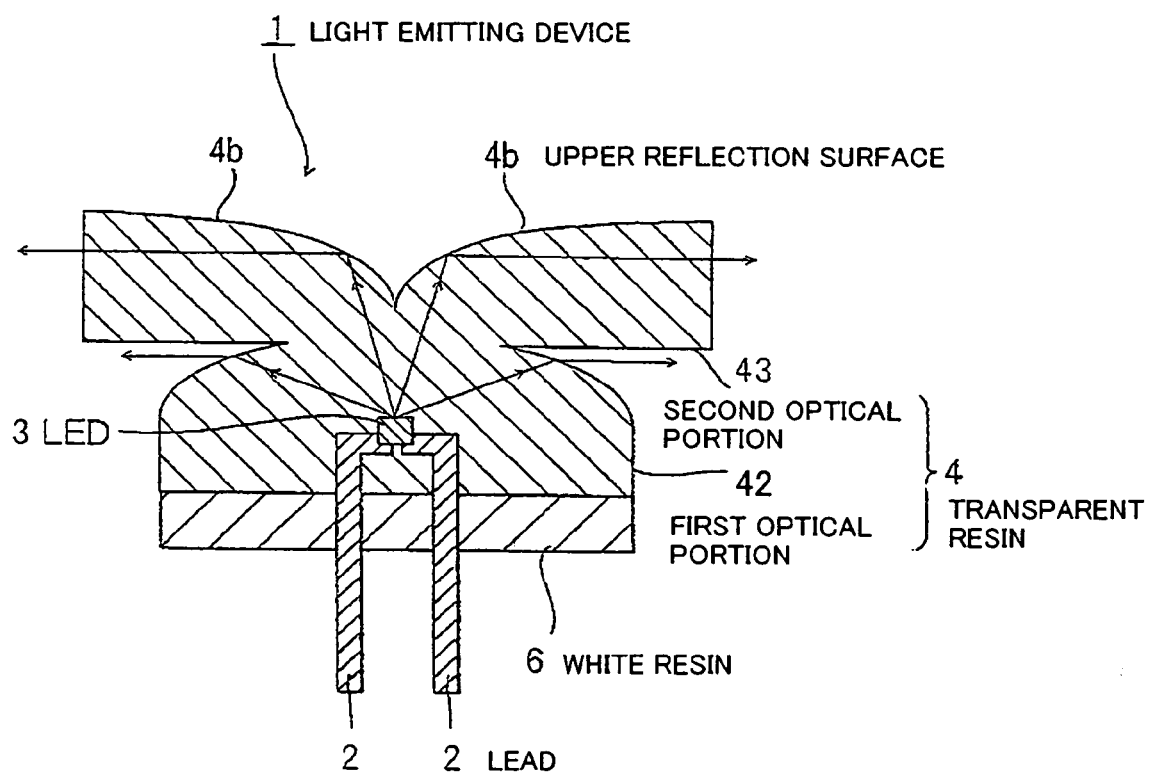
FIG. 25 is a cross sectional view showing a light emitting device in a twenty-fifth preferred embodiment according to the invention.

FIG. 25 is a cross sectional view showing a light emitting device in the twenty-fifth preferred embodiment according to the invention.

The light emitting device 1 of the twenty-fifth embodiment is featured in that the transparent resin 4 of the twenty-third embodiment is modified to comprises a first optical portion 42 like a convex lens and a second optical portion 43 which is formed stacked on the first optical portion as well as having the upper reflection surface 4b of the twenty-third embodiment on the top. Further, it is provided with the white resin 6 on the bottom thereof.

The other structural features of the twenty-fifth embodiment are the same as in the twenty-third embodiment.

Effects of the Twenty-Fifth Embodiment

The effects of the twenty-fifth embodiment are as follows.

Part of light from the LED 3 is radiated horizontally by the first optical portion 42. The other part thereof reaches the upper reflection surface 4b of the second optical portion 43, reflected thereon, horizontally radiated therefrom. Thus, nearly all of light from the LED 3 can be subjected to the external radiation control.

The package can be downsized.

Further, by the white resin 6, light radiated downward from the LED 3 can be reflected or scattered. Therefore, the light emitting device 1 can have enhanced light extraction efficiency.

In the injection molding, integral molding can be conducted using split molds even for a complex form as in this embodiment since the processing is not conducted at low viscosity as in epoxy resin.

The other effects of the twenty-fifth embodiment are the same as obtained in the twenty-third embodiment.

Twenty-Sixth Embodiment

Figure 26A:
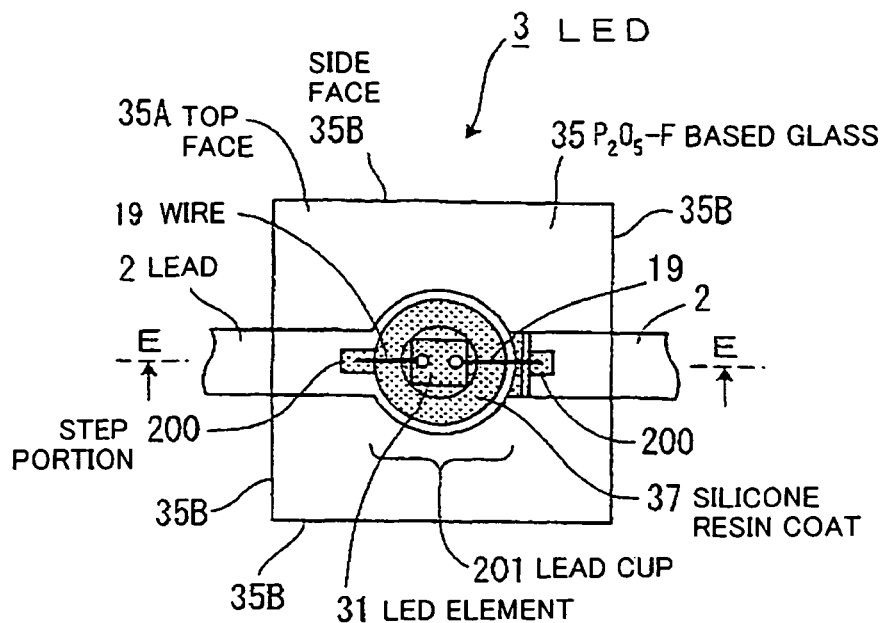
FIG. 26A is a plain view showing an LED in a twenty-sixth preferred embodiment according to the invention.
Figure 26B:
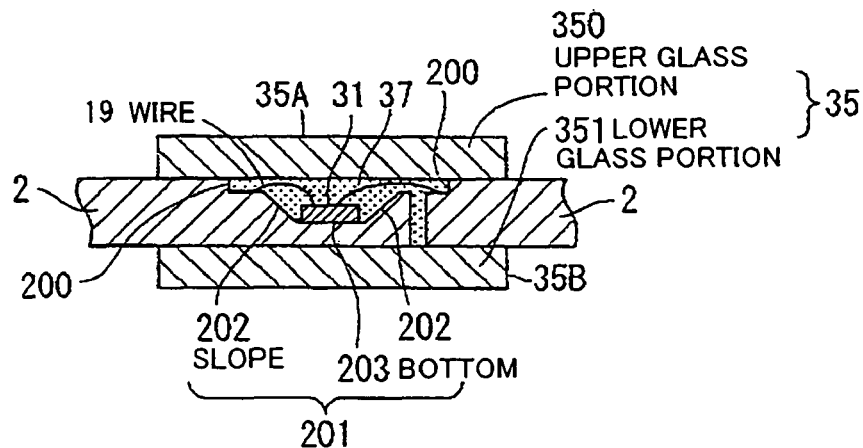
FIG. 26B is a cross sectional view cut along a line E-E in FIG. 26A.
Figure 26C:
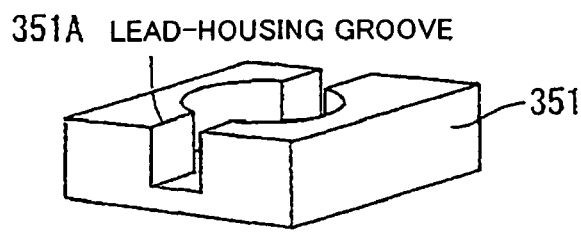
FIG. 26C is a perspective view showing a lower glass portion in FIG. 26B.

FIG. 26A is a plain view showing an LED in the twenty-sixth preferred embodiment according to the invention. FIG. 26B is a cross sectional view cut along a line E-E in FIG. 26A. FIG. 26C is a perspective view showing a lower glass portion in FIG. 26B.

The LED 3 comprises a face-up type GaN-based LED element 31, a lead 200, as a power supplying portion, which is provided with a lead cup 201 for mounting the GaN-based LED element 31, a wire 19 which electrically connects between the GaN-based LED element 31 and the lead 200, and a silicone resin coat 37 which protectively covers the GaN-based LED element 31 and the wires 19. Further, the GaN-based LED element 31 and the lead 200 are integrally sealed with $P_2O_5$—F-based glass 35 comprising a preformed upper glass portion 350 and lower glass portion 351.

The glass 35 comprises, on the basis of oxide, 43 wt % of $P_2O_5$, 4.3 wt % of $Li_2O$, 18.9 wt % of $Na_2O$, 10.7 wt % of $K_2O$, 23.5 wt % of $Al_2O_3$, and 11 wt % of F. It has properties: Tg=326° C., At=354° C., $\alpha=180 \times 10^{-7}$, nd=1.50, and υd=69.8.

The lead cup 201 is formed conical with a slope 202 and a bottom 203, and is placed in a lead-housing groove 351A formed in the lower glass portion 351 as shown in FIG. 26C. The lead-housing groove 351A is formed when performing the lower glass portion 351 by using a mold (not shown).

Effects of the Twenty-Sixth Embodiment

The effects of the twenty-sixth embodiment are as follows.

The glass sealed LED using the face-up type GaN-based LED element 31 can be obtained by covering the LED element 31 and the wired 19 with the silicone resin coat 37 to integrate them and providing the glass 35 thereon. In the process, the glass sealing is conducted at a temperature lower than 400° C. without generating decomposed gas of silicone molecule.

This glass sealed LED can be also overmolded with the transparent resin as described in the earlier embodiment. In this case, the lead 2 for mounting the LED element 31 may be drawn out as a lead from the transparent resin 4.

Although in this embodiment the seal material is of glass, it is not limited to a glass-state inorganic seal material and may be a glass material part of which is crystallized according to use.

Although in this embodiment the lead 2 has a thermal expansion coefficient equal to that glass 35, even when the lead 2 is made of soft copper which allows a small difference in thermal expansion coefficient, cracking of glass can be prevented due to the plasticity of the metal.

The light emitting devices 1 described in the above embodiments may be provided with a lens surface made of the transparent resin 4 or provided with a light-guiding member such as an optical waveguide. They may be used as a backlight for LCD. In this case, the transparent resin 4 may be provided with a reflection surface which allows light radiated sideward to be reflected toward the central axis of the LED element 31.

Twenty-Seventh Embodiment

Figure 27A:
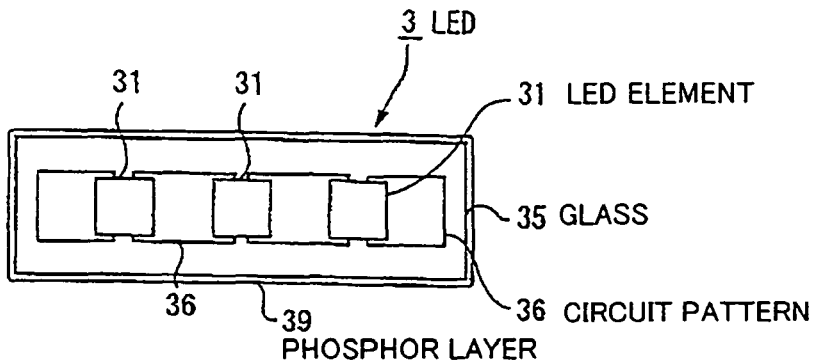
FIG. 27A is a plain view showing an LED in a twenty-seventh preferred embodiment according to the invention.
Figure 27B:
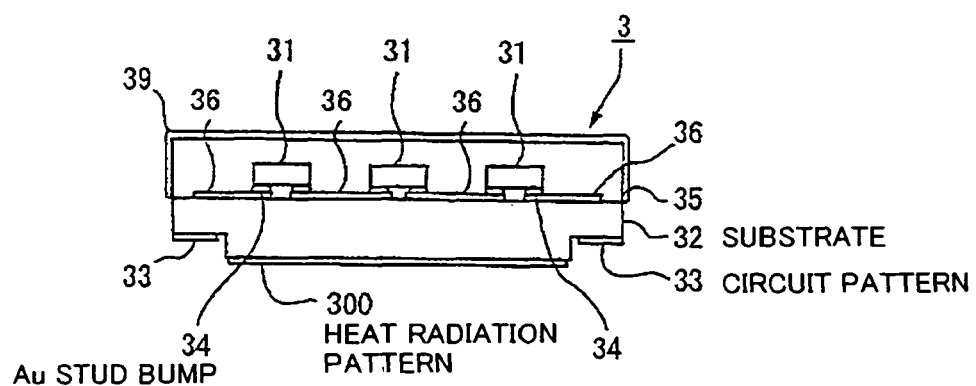
FIG. 27B is a side view showing the LED in FIG. 27A.
Figure 27C:
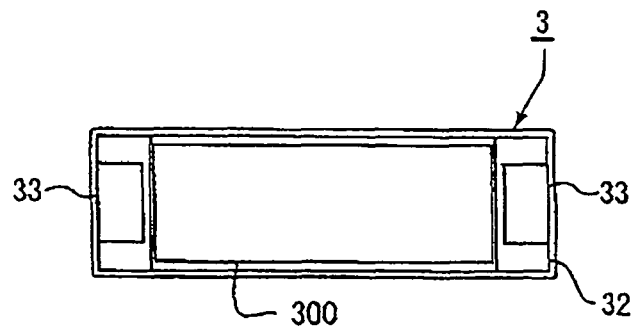
FIG. 27C is a bottom view showing the LED in FIG. 27A.

FIG. 27A is a plain view showing an LED in the twenty-seventh preferred embodiment according to the invention. FIG. 27B is a side view showing the LED in FIG. 27A. FIG. 27C is a bottom view showing the LED in FIG. 27A.

The LED 3 comprises a flip-chip type GaN-based LED element 31 to radiate blue light, a substrate 32, made of $Al_2O_3$ (with a thermal expansion coefficient of $7.2 \times 10$-6/° C.), on which the LED element 31 is mounted, glass 35 which seals the LED element 31 with a size of 346 μm square and the substrate 32, a circuit pattern 36 formed on the element mount side of the substrate 32, a circuit pattern 33 formed under the substrate 32 for external connection and electrically connected to the circuit pattern 36, and a heat radiation pattern 300 formed on the bottom for radiation of heat. The three LED elements 31 are linearly arrayed at pitches of 600 μm on the substrate 32. Although in this embodiment the three LED elements 31 are used, another number of LED elements 31 may be used therein.

The circuit patterns 33 and 36 are made of W—Ni—Au as in the first embodiment.

The glass 35 is made of ZnO-based glass with a thermal expansion coefficient of $6.5 \times 10^{-6}$/° C. On the surface of the glass 35, a phosphor layer 39 is formed which comprises a mixture of an inorganic material and Ce:YAG phosphor which is to be excited by blue light emitted from the LED element 31 and then to radiate yellow light.

The heat radiation pattern 300 radiates heat while externally conducting heat generated during operation of the LED element 31.

FIG. 28A is a plain view showing a backlight device with plural LED's as shown FIG. 27A as a light source. FIG. 28B is an enlarged side view showing part of the backlight device in FIG. 28A.

The backlight device 30 is composed of the five LED's 3 as shown in FIG. 27A. The five LED's 3 are disposed integrated at one end portion of a plate-like light-guiding member 301 made of transparent acrylic resin. Further, a plate-like heat radiation portion 302 made of copper is provided to efficiently radiate heat generated from the LED's 3. The LED 3 is, as shown in FIG. 28B, attached to the heat radiation portion 302 by bonding through Au—Sn the heat radiation pattern 300 thereto.

The light-guiding member 301 is provided with a condensing reflective surface 301A formed a parabolic surface of revolution with the LED 3 as origin at one end thereof, and has a maximum thickness of 3 mm.

The heat radiation portion 302 is provided with folds 302A whereby it is folded like inverted-C at one end thereof such that a bond portion to the LED's 3 is located at the top side and the light-guiding member 301 bonded to the bond portion is located at the top side. There is provided a space developed by folding the heat radiation portion 302, and a circuit board 38 electrically connected to an electrode terminal 45 being connected to an external connection circuit pattern (not shown) for the LED 3 is placed in the space.

The circuit board 38 has a wiring pattern (not shown) formed thereon for electrical connection to an external device. It is connected through the electrode terminal made of a copper lead to the external connection circuit pattern (circuit pattern 33 as shown in FIG. 27B) for the five LED's 3. The electrode terminal 45 may be made of another material or form such as a flexible printed circuit board (FPC) other than the copper lead.

The process of making the backlight device 30 will be described below.

At first, the heat radiation portion 302 is formed by stamping a plate copper material into a given form. The bond portion is simultaneously formed corresponding to the form of the LED 3.

Then, the stamped heat radiation portion 302 is bonded through Au—Sn to the heat radiation pattern 300 of the five LED's 3.

Then, the electrode terminal 45 is boned through Au—Sn to the external connection circuit pattern of the LED 3. In this process, a lead frame with the electrode terminals 45 corresponding to the five LED's 3 is in the lump bonded thereto.

Then, the plate-like light-guiding member 301 is formed by injection molding of acrylic resin to cover part of the heat radiation portion 302 where the LED 3 is bonded. In this process, the collecting reflective surface 301A as shown in FIG. 28B is formed on the LED 3 seal side of the light-guiding member 301.

Then, the electrode terminals 45 exposed from the light-guiding member 301 is cut off from the lead frame and is solder-bonded to the circuit board 38 prepared in a separate process.

Then, the heat radiation portion 302 is folded. In this process, the two folds 302A are formed such that the folded heat radiation portion 302 covers the circuit board 38.

The backlight device 30 operates when power is supplied from an external circuit connected to the circuit board 38 through the electrode 45 to the LED 3. Upon the supply of power, the LED element 31 of the LED 3 emits blue light with an emission wavelength of about 470 nm. This blue light is irradiated to the phosphor layer 39 formed on the glass 35, whereby the phosphor is excited and radiates yellow light. The blue light and the yellow light are mixed to develop white light. All light beams thereof are generated inside the light-guiding member 301 and forwarded through the light-guiding member 301.

Effects of the Twenty-Seventh Embodiment

The effects of the twenty-seventh embodiment are as follows.

Since the LED element 31, the substrate 32 and the substrate 32 have an equal thermal expansion coefficient, cracking of glass can be prevented in the process of glass sealing even when the plural LED elements 31 are close arrayed. Thus, the sealing process can be safe performed.

Further, since the heat radiation portion 302 with the heat radiation pattern 300 is provided at the backside of the substrate 32 for mounting the LED element 31, a failure in characteristic of the LED element 31 can be prevented even when the substrate 32 is made of alumina and 100 mA current is flown through each of the LED elements 31. Thus, thermal stability can be obtained. Since alumina has a high reflectivity to white color, an excellent optical property and a high physical strength as well as offering low cost, the glass sealed LED 3 with a high thermal stability can be produced at low cost.

The backlight device 30 uses the glass sealed LED 3 as a light source. Thus, Au wire or Au bump for electrical connection with the LED element 31 is not provided or exposed. Therefore, it has a mechanical strength durable for the injection molding of the light-guiding member 301, and its mass productivity can be enhanced.

Further, since the glass sealed LED 3 has a thermal resistance higher than a resin sealed LED, it can be fabricated by Au—Sn bonding and also applied to the soldering thermal treatment after the Au—Sn bonding as well as offering a high heat radiation property.

Further, since the light-guiding member 301 is provided with the collecting reflective surface 301A formed a parabolic surface of revolution with the LED 3 as origin at one end thereof, high-brightness white light developed by the mixture of blue light emitted from the LED element 31 and yellow light radiated from the phosphor layer 39 can be forwarded with nearly all light beams thereof through the light-guiding member 301. Thus, backlight illumination can be developed with high efficiency. In detail, light radiated downward from the LED element 31 in FIG. 28B is reflected leftward by the collecting reflective surface 301A and forwarded through the light-guiding member 301 together with light radiated leftward from the LED element 31 without reaching the collecting reflective surface 301A.

Modification

Figure 29:
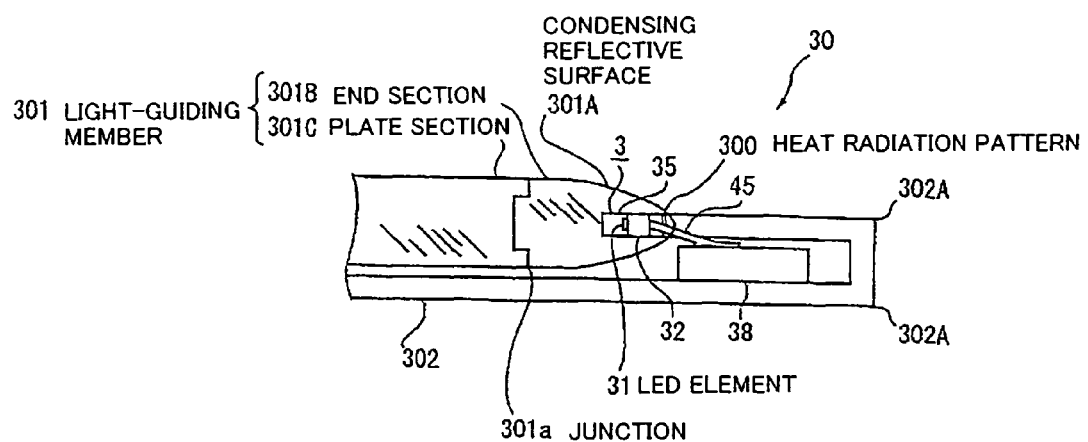
FIG. 29 is a side view showing part of a modification of the backlight device as shown in FIG. 28A.

FIG. 29 is a side view showing part of a modification of the backlight device as shown in FIG. 28A.

The backlight device 30 in modification has the light-guiding member 301 comprising an end section 301B and a plate section 301C, and the LED 3 is sealed with the end section 301B. At a junction 301a, the end section 301B is concave-convex bonded to the plate section 301C through an optical adhesive with an equal optical property. In place of the phosphor layer 39 of the LED 3, a glass 35 with a phosphor spread therein is used. Meanwhile, this modification has the same structure as shown in FIG. 28B except for the light-guiding member 301 comprising the two members.

In this modification, since the end section 301B for sealing the LED 3 and the plate section are made of separate members and concave-convex bonded each other, the plate section 301C, for example, corresponding to the size of a display device such as an LCD panel which is subjected to the backlight illumination can be selectively bonded to construct the backlight device. Thus, the fabrication process of different backlight devices can be easy conducted.

Although in this modification the end section 301B is concave-convex bonded to the plate section 301C, another plate section 301C may be combined to the plate section 301C by providing a convex junction portion 301a at the end of the plate section 301C.

Further, when the light-guiding member 301 has a thickness of 5 mm or more, the LED 3 may be covered with acrylic resin containing a phosphor with a certain thickness and then the light-guiding member 301 may be formed thereon. In this case, the LED element 31 may emit ultraviolet light and the phosphor may radiate a continuous spectrum including blue, green and red lights or monochromatic light while being excited by the ultraviolet light. In this case, the acrylic resin material can be a material less likely to deteriorate to ultraviolet light.

The inventor's experiments confirm that the cracking of glass is generated to fail in the sealing process when an LED element with a size of 346 μm square is arrayed at pitches of 600 μm and sealed with a glass material with a thermal expansion coefficient of $11.4\times10^{-6}/°$ C. and a yielding point of 415° C., and that the cracking of glass can be prevented to succeed in the sealing process when an LED element with a size of 346 μm square is arrayed at pitches of 500 μm and sealed with a glass material with a thermal expansion coefficient of $6.7\times10^{-6}/°$ C. and a yielding point of 490° C. In these experiments, the substrate and the glass have an equal thermal expansion coefficient.

Twenty-Eighth Embodiment

Figure 30:
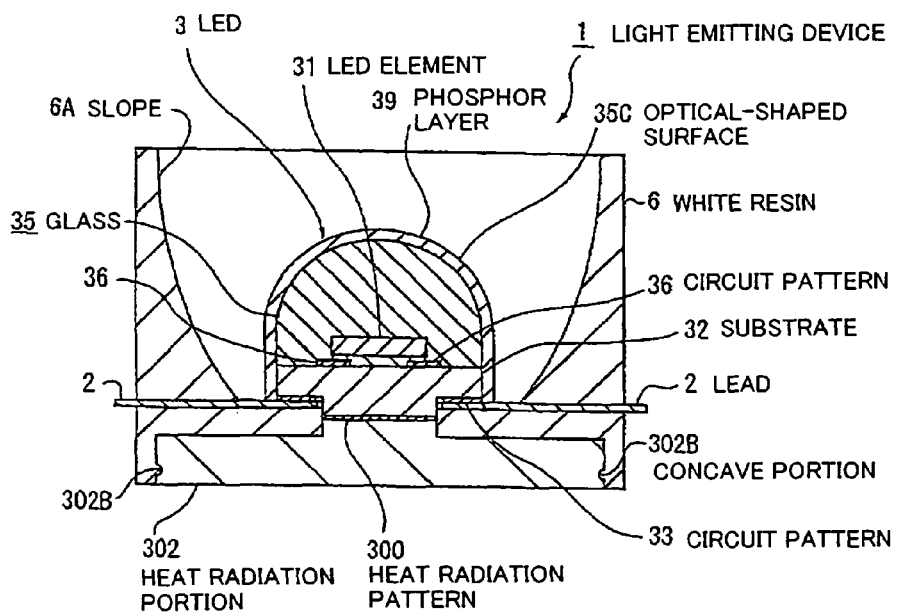
FIG. 30 is a cross sectional view showing a light emitting device in a twenty-eighth preferred embodiment according to the invention.

FIG. 30 is a cross sectional view showing a light emitting device in the twenty-eighth preferred embodiment according to the invention.

The light emitting device 1 comprises: a glass 35 which seals an LED element 31 with a size of 600 μm square and is provide with an optical-shaped surface 35C nearly in semi-sphere form; an LED 3 which has on its surface a thin-film phosphor layer 39 formed by injection molding of a mixture of a Ce:YAG phosphor and transparent acrylic resin; a case-like white resin 6 which houses the LED 3 and is opened at the light extraction side; a pair of leads 2 which is integrated with the white resin 6 and exposed in the opening where the LED 3 is mounted; and a heat radiation portion 302 which is bonded through Au—Sn to the heat radiation pattern 300 of the LED 3 and integrally sealed with the white resin 6. Meanwhile, the LED element 31, the substrate 32 and the glass 35 all have an equal thermal expansion coefficient of $7\times10^{-6}/°$ C.

The LED 3 is mounted on the bottom of the case-like white resin 6, and the circuit pattern 33 of the substrate 32 is bonded through Au—Sn to the lead 2 exposed at the bottom. The heat radiation pattern 300 of the substrate 32 is bonded through Au—Sn to the heat radiation portion 302 made of copper slag. The heat radiation portion 302 has a side exposed at the surface of the white resin 6 so as to externally radiate heat generated from the LED 3 during the operation.

The heat radiation portion 302 has a concave portion 302B to prevent the separation from the white resin 6 caused by the deformation due to thermal expansion.

The white resin 6 is provided with a curved slope 6A at the sidewall of the opening where the LED 3 is placed in. The slope 6A can reflect white light developed by the mixture of blue light emitted from the LED element 31 and yellow light radiated from the phosphor excited by the irradiation of blue light to externally radiate efficiently.

Effects of the Twenty-Eighth Embodiment

The effects of the twenty-eighth embodiment are as follows.

Since the glass 35 is provided with the semispherical optical-shaped surface 35C, the total reflection based on the refractive index difference between the glass 35 and the air can be prevented. Thereby, uniform incidence of light into the phosphor layer 39 can be obtained across the layer. Thus, the light emitting device 1 can prevent unevenness in emission color as well as having high brightness. Even if the separation happens at the interface between the glass 35 and the phosphor layer 39, significant reduction in optical property can be prevented since the light extraction efficiency from the LED 3 is kept nearly equal.

Further, since the LED element 31, the substrate 32 and the glass 35 has an equal thermal expansion coefficient, the cracking of the glass 35 can be prevented to succeed in the glass sealing by reducing the difference in thermal expansion coefficient between the LED element 31 and the glass 35 even when the LED element 31 has a size of 500 μm square or more as large current type greater than typical size.

Further, due to having the heat radiation pattern 300, even the large current type LED element 31 can be used without problems in thermal aspect.

The inventor's experiments confirm that the cracking of glass is generated to fail in the sealing process when an LED element with a size of 600 μm square is sealed with a glass material with a thermal expansion coefficient of $11.4 \times 10^{-6}/°$ C. and a yielding point of 415° C., and that the cracking of glass can be prevented to succeed in the sealing process when an LED element with a size of 1000 μm square sealed with a glass material with a thermal expansion coefficient of $6.7 \times 10^{-6}/°$ C. and a yielding point of 490° C. In these experiments, the substrate and the glass have an equal thermal expansion coefficient.

Twenty-Ninth Embodiment

Figure 31A:
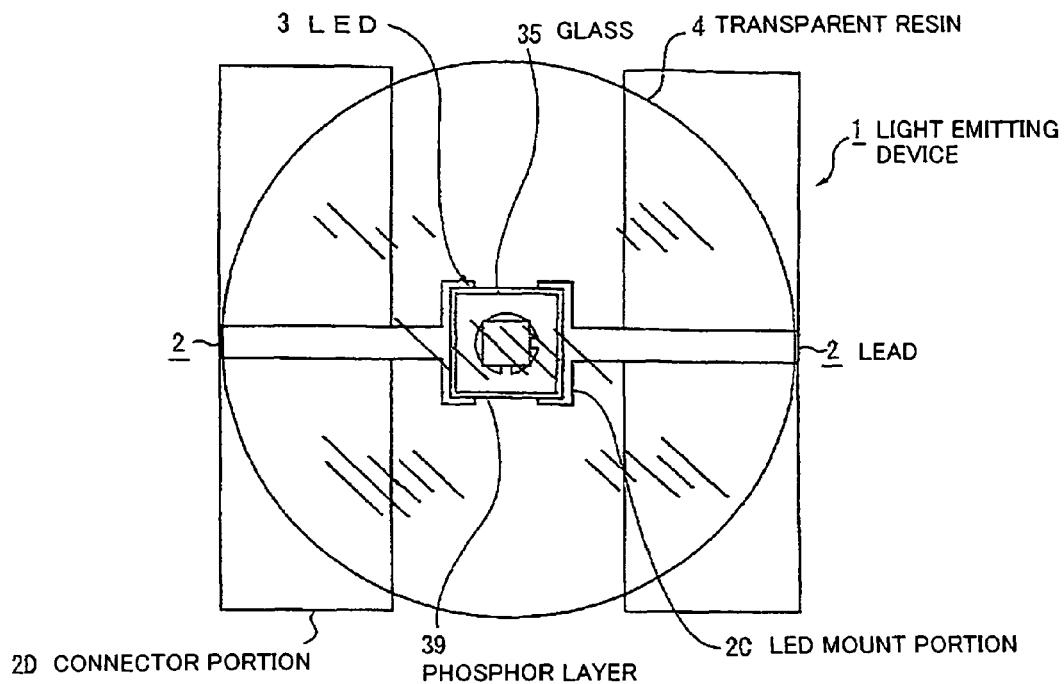
FIG. 31A is a plain view showing a light emitting device in a twenty-ninth preferred embodiment according to the invention.
Figure 31B:
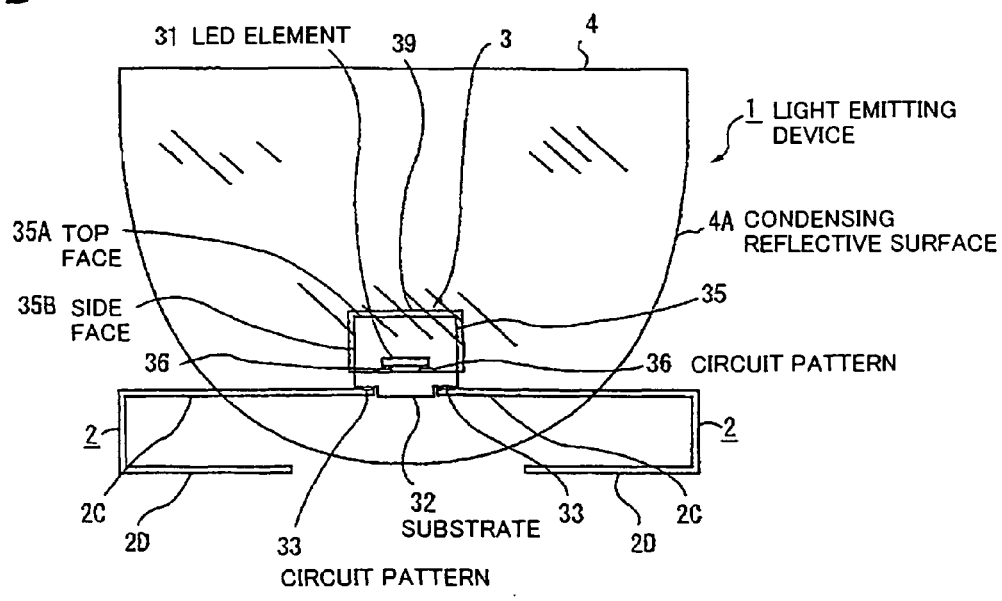
FIG. 31B is a cross sectional view cut along a lead in FIG. 31A.

FIG. 31A is a plain view showing a light emitting device in the twenty-ninth preferred embodiment according to the invention. FIG. 31B is a cross sectional view cut along a lead in FIG. 31A.

The light emitting device 1 is provided with the transparent resin 4 which is made of acrylic resin and seals the LED 3 mounted on the lead 2 and which is provided with a collecting reflective surface 4A formed a parabolic surface of revolution with the LED 3 as origin. In this embodiment, the LED 3 as a light source is provided with one LED element 31 sealed with glass 35. There is provided a phosphor layer 39 containing a Ce:YAG phosphor on the surface of the LED 3.

The lead 2 is sealed with the transparent resin 4 at part thereof, and comprises an LED mount portion 2C on which the LED 3 is mounted and a connector portion 2D which is continuous with the LED mount portion 2C and is electrical connected to an external circuit. The connector portion is formed inverted-C by being folded at fold portions 2E. The LED mount portion 2C has a small width so as to prevent the separation from the transparent resin 4. The connector portion 2D has a width greater than the LED mount portion 2C so as to secure the stability in mounting the light emitting device 1 and the heat radiation property.

Figure 32:
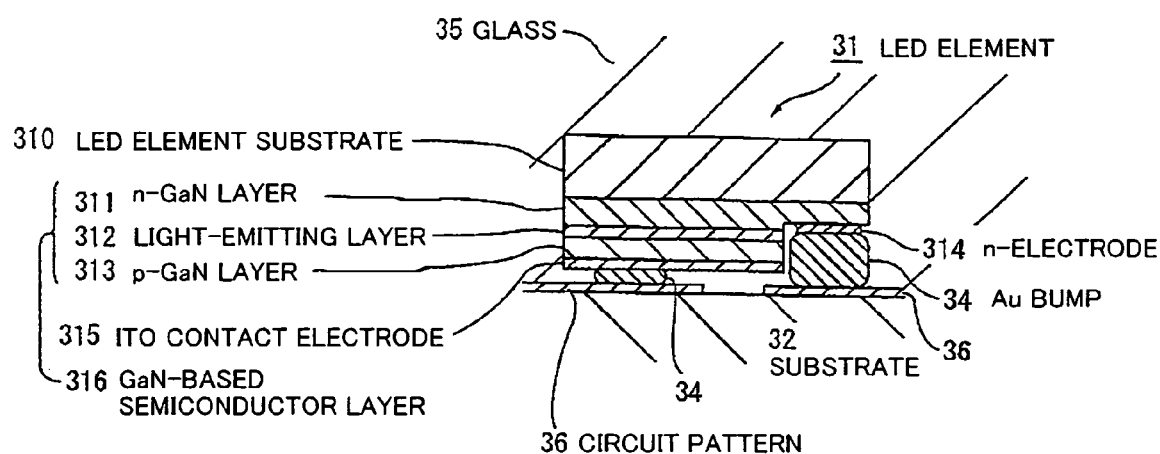
FIG. 32 is a partially enlarged cross sectional view showing details of an LED element provided in LED of each of the above embodiments.

FIG. 32 is a partially enlarged cross sectional view showing details of an LED element provided in LED of each of the above embodiments.

The LED element 31 comprises, formed on an element substrate 310 made of GaN semiconductor compound, a Si-doped n-GaN layer 311, a non-doped GaN light emitting layer 312, a Mg-doped p-GaN layer 313, an n-electrode 314 which is made of Al and formed on the n-GaN layer 311 at part exposed by etching the p-GaN layer 313 through the n-GaN layer 311, and an ITO contact electrode 315 formed on the P-GaN layer 313. The b-GaN layer 311, the light emitting layer 312 and the p-GaN layer 313 composes a GaN-based semiconductor layer 316. The n-electrode 314 and the ITO contact electrode 315 are mounted through the Au stud bump 34 on the circuit pattern 36 formed on the substrate 32 made of $Al_2O_3$.

The LED element 31 is sealed with bismuth-based glass with a refractive index of 1.85 and a thermal expansion coefficient of $6.5 \times 10^{-6}/°$ C.

In operation, blue light emitted from the LED element 31 allows the excitation of the phosphor layer 39 formed on the glass 35, whereby yellow light radiated based on the excitation is mixed with blue light to develop white light. The white light enters into the white resin 6, and a part of the white light reaches the colleting reflective surface 4A and is totally reflected on the interface of the transparent resin 4 and the air to be externally radiated in a direction parallel to the optical axis of the LED 3.

Effects of the Twenty-Ninth Embodiment

The effects of the twenty-ninth embodiment are as follows.

In the LED element 31, the element substrate 310 is made of GaN as well as the GaN-based semiconductor layer 316. If there is a difference in refractive index between the element substrate 310 and the GaN-based semiconductor layer 316, optical loss will be caused by light being confined in the GaN-based semiconductor layer 316 with large optical absorption. However, because of having no difference in refractive index therebetween, such optical loss does not occur.

Furthermore, since the glass 35 has a refractive index of about 70% or more to GaN, the critical angle becomes 45 degrees or more. Thus, emitted light can be efficiently extracted through the upper and faces of the LED element 31 toward the glass 35.

With respect to the incidence of light from the glass 35 to the transparent resin 4, since the refractive index difference therebetween is smaller than that between the glass and the air, optical loss due to the interface reflection lowers. As a result, light emitted from the LED element 31 can be efficiently extracted through the transparent resin 4. Due to the enhanced light extraction efficiency, heat generation can be also reduced.

Since the LED element 31 is sealed with glass instead of resin, the restriction of maximum supplied power can rely on the LED element (LED element temperature) not on the seal resin. In this regard, since the heat generation is reduced, the light output can be increased by increasing the supplied power. Alternatively, when the maximum supplied power is restricted within a conventional one, the simplification and downsizing of the heat radiation structure can be developed. Further, the light emitting device 1 can have high emission efficiency.

Since the transparent resin 4 is provided with the collecting reflective surface 4A formed a parabolic surface of revolution with the LED 3 as origin, emitted light can be radiated in a desired direction without a particular reflecting structure such as a case. Due to the glass sealed LED 3, the optical surface of the transparent resin 4 can be easy formed by the injection molding. Thus, the manufacture process and the device structure can be simplified. Also, the light emitting device 1 can have high brightness as well as long-term reliability.

The shape of the glass 35 for sealing the LED element 31 is not limited to rectangular as exemplified and may be semi-spherical.

The phosphor layer 39 may be omitted to allow a blue light source.

The glass 35 may be provided with fine uneven surface to promote the light scattering, whereby the light extraction efficiency can be enhanced.

Other Embodiments

Although the conventional LED light sources are limited by resin for sealing the LED element and the manufacture process, resin shaping free from such a limitation can be conducted by considering the glass sealed LED element as the conventional LED element (not sealed). For example, the transparent resin 4 in the second, fourth, sixth to tenth, thirteenth, fifteenth and sixteenth embodiments may be formed a lamp type.

In the twenty-ninth embodiment, the element substrate 310 of the LED element 31 may be made of another material which has a light transmittance to the emission wavelength of light emitted from the light emitting layer 312 and a refractive index equal to the GaN-based semiconductor layer 316. The substrate may be other than the substrate used to grow the GaN-based semiconductor layer 316. For example, after the GaN-based semiconductor layer 316 is grown on the sapphire substrate, the sapphire substrate may be lifted off and another substrate made of GaN, SiC, $TiO_2$, $Ga_2O_3$ etc. may be attached thereto.

The glass 35 for sealing the LED element 31 may be made of a low-melting glass such as $SiO_2$—$Nb_2O_5$-based, ZnO-based and $SiO_2$—$PbO_3$-based glass. In this case, although it is advantageous for light extraction efficiency from the LED element 31 that there is a small refractive index difference between the LED element 31 and the glass 35, on the contrary, there is a problem in light extraction that a limitation in shape is developed to prevent the total reflection at the interface glass 35 and the outside thereof if the difference is too small, as a result, the rate of reflection at the interface increases even in perpendicular incidence to the interface. Thus, an optimum and substantially ideal light extraction efficiency can be obtained by controlling the refractive index of the glass 35 to be in the range of 0.68 to 0.85 as a ratio to the light emitting layer of the LED element 31. This range can be applied to another material other than GaN with a refractive index of n=2.4.

The overmolding of transparent resin 4 etc. for sealing the LED 3 is not limited to the total reflection type taking the light distribution into account and may be in various forms, e.g., partly provide with white coat of high reflectivity or with metal reflection film.

Further, the transparent resin 4 in the twentieth to twenty-ninth embodiments may contain a phosphor.

The light emitting device of the invention as exemplified in the above embodiments can be applied to various optical devices or elements such as a light-emitting device or element, a light-receiving device or element, and a solar cell.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
a surface mounting type light emitting diode (LED) comprising an LED chip flip-chip mounted, a first power supply portion for supplying power to the LED chip, and an inorganic sealing material that seals the LED chip;
a second power supply portion for supplying power to the surface mounting type LED; and
a resin that seals the surface mounting type LED,
wherein the resin comprises an optical-shaped surface,
wherein said second power supply portion supplies power to the LED chip via the first power supply portion,
wherein the surface mounting type LED comprises external connecting terminals on a bottom surface thereof for a negative electrode and a positive electrode, and is surface-mounted on the second power supply portion at a part of the second power supply portion opposite the external connecting terminal.

2. A light emitting device, comprising:
a surface mounting type light emitting diode (LED) comprising an LED chip, a first power supply portion that comprises a conductive pattern on which the LED chip is mounted and which supplies power to the LED chip, and an inorganic sealing material that seals the LED chip and has a thermal expansion coefficient equal to the first power supply portion;
a second power supply portion that supplies power to the surface mounting type LED; and
a resin that seals the surface mounting type LED,
wherein the resin comprises an optical-shaped surface,
wherein said second power supply portion supplies power to the LED chip via the first power supply portion, and
wherein the surface mounting type LED comprises external connecting terminals on a bottom surface thereof for a negative electrode and a positive electrode, and is surface-mounted on the second power supply portion at a part of the second power supply portion opposite the external connecting terminal.

3. The light emitting device according to claim 1, wherein: the first power supply portion comprises glass-containing $Al_2O_3$, $Al_2O_3$ or AlN.

4. The light emitting device according to claim 2, wherein: the first power supply portion comprises glass-containing $Al_2O_3$, $Al_2O_3$ or AlN.

5. A light emitting device, comprising:
a surface mounting type light emitting diode (LED) comprising an LED chip, a first power supply portion that comprises a metal material for supplying power to the LED chip, and an inorganic sealing material that seals the LED chip;
a second power supply portion for supplying power to the surface mounting type LED; and
a resin that seals the surface mounting type LED,
wherein the resin comprises an optical-shaped surface,
wherein said second power supply portion supplies power to the LED chip via the first power supply portion, and
wherein the surface mounting type LED comprises external connecting terminals on a bottom surface thereof for a negative electrode and a positive electrode, and is surface-mounted on the second power supply portion at a part of the second power supply portion opposite the external connecting terminal.

6. The light emitting device according to claim 5, wherein: the first power supply portion and the second power supply portion comprise a common member.

7. The light emitting device according to claim 2, wherein the LED chip comprises a flip-chip mount type.

8. The light emitting device according to claim 5, wherein the LED chip comprises a flip-chip mount type.

9. The light emitting device according to claim 1, wherein: the resin for sealing the surface mounting type LED has a width twice or more greater than the LED chip, where the width is a width relative to a central axis of the LED chip.

10. The light emitting device according to claim 2, wherein the surface mounting type LED comprises an inorganic substrate which comprises the first power supply portion, and
wherein, at a same temperature, the LED chip, the inorganic substrate, and the inorganic sealing material have an equal thermal expansion coefficient.

11. The light emitting device according to claim 1, wherein the LED chip comprises a semiconductor layer, a light emitting layer, and a substrate that has a refractive index equal to that of the semiconductor layer including the light emitting layer, and the LED chip is sealed with the inorganic sealing material with a refractive index ratio in a range of 0.68 to 0.85 relative to the LED chip.

12. The light emitting device according to claim 2, wherein the LED chip comprises a semiconductor layer, a light emitting layer, and a substrate that has a refractive index equal to that of the semiconductor layer including the light emitting layer, and the LED chip is sealed with the inorganic sealing material with a refractive index ratio in a range of 0.68 to 0.85 relative to the LED chip.

13. The light emitting device according to claim 5, wherein the LED chip comprises a semiconductor layer, a light emitting layer, and a substrate that has a refractive index equal to that of the semiconductor layer including the light emitting layer, and the LED chip is scaled with the inorganic sealing material with a refractive index ratio in a range of 0.68 to 0.85 relative to the LED chip.

14. The light emitting device according to claim 2, wherein the conductive pattern comprises a patterned metal layer.

15. The light emitting device according to claim 5, wherein the metal material comprises a patterned metal layer.

16. The light emitting device according to claim 1, further comprising:
a reflective surface formed around the surface mounting type LED.

17. The light emitting device according to claim 2, further comprising:
a reflective surface formed around the surface mounting type LED.

18. The light emitting device according to claim 5, further comprising:
a reflective surface formed around the surface mounting type LED.

* * * * *